(12) United States Patent
Shibutani

(10) Patent No.: US 10,018,669 B2
(45) Date of Patent: Jul. 10, 2018

(54) ELECTRICAL CONTACTOR AND ELECTRICAL CONNECTING APPARATUS

(71) Applicant: KABUSHIKI KAISHA NIHON MICRONICS, Tokyo (JP)

(72) Inventor: Kenichi Shibutani, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 41 days.

(21) Appl. No.: 15/280,148

(22) Filed: Sep. 29, 2016

(65) Prior Publication Data

US 2017/0146593 A1 May 25, 2017

(30) Foreign Application Priority Data

Nov. 25, 2015 (JP) .................................. 2015-229513

(51) Int. Cl.
*G01R 31/28* (2006.01)
*G01R 1/067* (2006.01)

(52) U.S. Cl.
CPC ..... *G01R 31/2889* (2013.01); *G01R 1/06722* (2013.01)

(58) Field of Classification Search
CPC .......................... G03G 31/2889; G01R 31/2889
See application file for complete search history.

(56) References Cited

U.S. PATENT DOCUMENTS

| | | | |
|---|---|---|---|
| 2006/0073710 A1 | 4/2006 | Hwang | |
| 2007/0128906 A1* | 6/2007 | Kazama | G01R 1/06722 439/179 |
| 2009/0075529 A1* | 3/2009 | Johnston | H01R 13/2421 439/824 |

FOREIGN PATENT DOCUMENTS

| | | |
|---|---|---|
| JP | 2012_181096 A | 9/2012 |
| JP | 2015-40134 | 3/2015 |
| KR | 102006_0127960 | 12/2006 |
| KR | 10_1328581 B1 | 11/2013 |

OTHER PUBLICATIONS

Page 4 of Korean First Office Action dated Oct. 17, 2017 in corresponding Korean Patent Appln. No. 2016-0117751.
Search Report in corresponding Taiwan Patent Appln. No. 10527692 dtd Jun. 8, 2017.

* cited by examiner

*Primary Examiner* — Clayton E Laballe
*Assistant Examiner* — Jas Sanghera
(74) *Attorney, Agent, or Firm* — Bacon & Thomas, PLLC

(57) ABSTRACT

An electrical contactor of this invention includes: a first plunger to contact one member, the first plunger including a tip portion formed into a plurality of chevron shapes; a second plunger to contact a counterpart member, the second plunger working in cooperation with the first plunger to form electrical conduction between the one member and the counterpart member; and a spring part to couple the tip portion of the first plunger and a tip portion of the second plunger while the tip portion of the first plunger and the tip portion of the second plunger are pointed in opposite directions. The spring part covers an outer periphery of a part where the first plunger and the second plunger are coupled and supports the first plunger and the second plunger in a manner that allows the first plunger and the second plunger to slide relative to each other.

6 Claims, 28 Drawing Sheets

FIG.8
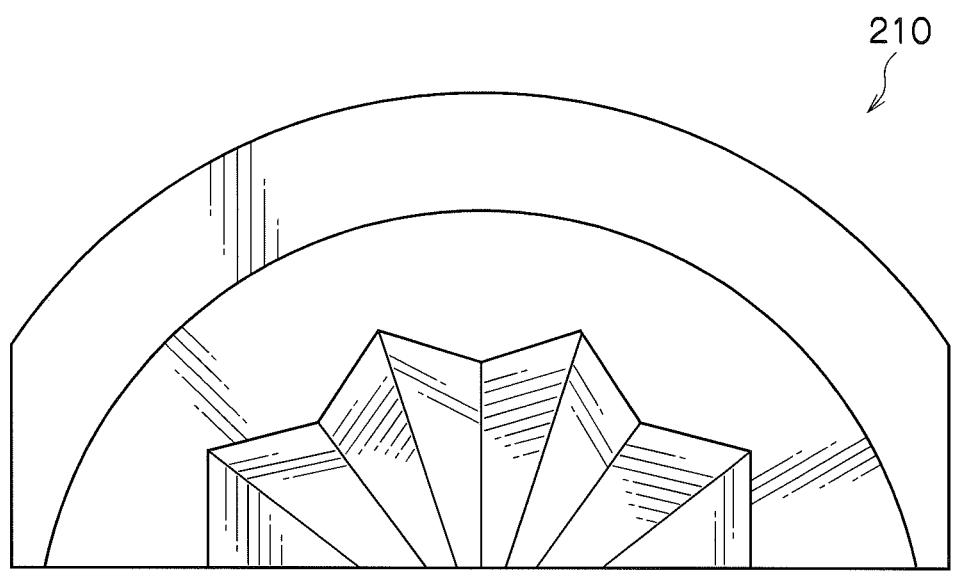
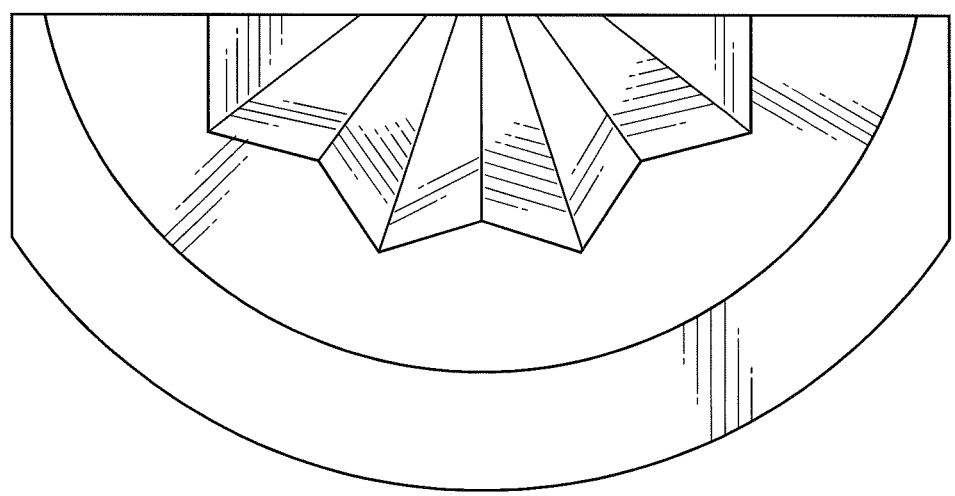

ELECTRICAL CONTACTOR AND ELECTRICAL CONNECTING APPARATUS

CROSS-REFERENCE TO RELATED APPLICATION

This application claims, under 35 USC 119, priority of Japanese Application No. 2015-229513 filed on Nov. 25, 2015.

BACKGROUND OF THE INVENTION

1. Technical Field

This invention relates to an electrical contactor and an electrical connecting apparatus that are, for example, applicable as an electrical contactor to contact an electrode provided in a wiring substrate, a semiconductor integrated circuit, etc., and an electrical connecting apparatus including a plurality of electrical contactors.

2. Description of Related Art

A well-known electrical contactor is to electrically connect electrical circuits on wiring substrates arranged to face each other, for example. An example of such an electrical contactor can be found in Patent Document 1 (Japanese Patent Laid-Open No. 2015-40734).

FIG. 23A is an enlarged front sectional view showing a part of a conventional electrical connecting apparatus where a conventional electrical contactor 90 is attached. FIG. 23B is an enlarged side sectional view showing the part where the electrical contactor 90 of FIG. 23A is attached.

FIGS. 23A and 23B show a state where the electrical contactor 90 is provided in a housing 17 of the electrical connecting apparatus and the electrical contactor 90 is electrically connected to an electrode 13 of a device under test and a contact pad 22 of a wiring substrate 15.

For example, the electrical contactor 90 includes two first plungers 91, a second plunger 92, and a compressed coil spring 93. Each of the two first plungers 91 is a plate-like plunger to contact the electrode 13 of a device under test. The second plunger 92 is a plate-like plunger to contact the contact pad 22 provided on the upper surface of the wiring substrate 15.

Each of the first plungers 91 is inserted into the compressed coil spring 93. The second plunger 92 is inserted into the compressed coil spring 93 from a direction opposite to a direction in which each of the first plungers 91 is inserted into the compressed coil spring 93.

The two first plungers 91 are arranged to overlap each other while the second plunger 92 is caught between the first plungers 91. Specifically, while the second plunger 92 is caught between the two first plungers 91, apart where the two first plungers 91 and the second plunger 92 overlap each other is inserted into the compressed coil spring 93. A spring receiving portion 911 of each of the first plungers 91 and a spring receiving portion 921 of the second plunger 92 contact the compressed coil spring 93.

When the electrical connecting apparatus is used while the electrical contactor 90 is incorporated in the housing 17 of the electrical connecting apparatus, the compressed coil spring 93 receives external force to exert elastic force in a vertical direction. This electrically connects a tip portion 91A of each of the first plungers 91 to the electrode 13, while electrically connecting an end portion of the second plunger 92 to the contact pad 22.

SUMMARY OF THE INVENTION

However, using the electrical connecting apparatus housing the aforementioned electrical contactor brings about the following problem.

For example, as shown in FIG. 24, if the two first plungers 91 are to contact the electrode 13, each of the first plungers 91 is electrically connected to the electrode 13 at two points. Meanwhile, as a result of the plate-like shape of the first plunger 91, one of the two first plungers 91 may be displaced if these first plungers 91 are to contact the electrode 13, as shown in FIG. 25. This applies a load only to the tip portion 91A of the first plunger 91 contacting the electrode 13. Hence, a tip shape of the tip portion 91A may be deformed or damaged, for example, due to reason such as wear resulting from contact with the electrode 13. This makes it impossible for the tip portion 91A to contact the electrode 13 properly, possibly causing a problem of degradation of contact resistance. The strength of the first plunger 91 cannot be ensured as a result of its plate-like shape. Further, a pitch between the two first plungers 91 is reduced as a result of size reduction of the electrode 13 and the electrical contactor 90. Hence, the displacement of the first plunger 91 cannot be corrected easily.

If the tip portions 91A of the two first plungers 91 are to contact the electrode 13 of a ball shape, for example, the tip portion 91A of one or each of the first plungers 91 slides along the surface of the ball-shaped electrode 13. In this case, as shown in FIG. 26, the first plunger 91 may be expanded outwardly. In this case, the first plunger 91 in a state of FIG. 27A before contacting the electrode 13 is brought into a state of FIG. 27B after contacting the electrode 13. This makes a corner E of the plate-like first plunger 91 interfere with the housing 17 to cut away the corner E of the first plunger 91. Residue resulting from the cutting might cause contact failure. This may be overcome by using a long-hole shape as the hole shape of the housing 17 to which the electrical contactor 90 is to be attached, as shown in FIGS. 28A and 28B. However, forming a long-hole shape in turn causes a problem of cost increase.

If the electrical connecting apparatus is used in a low-temperature environment, dew condensation may occur. In this case, action should be taken against contact failure. For example, as shown in FIG. 27A, a gap Op may be formed between the housing 17 and the first plunger 91. Droplets resulting from the dew condensation may flow through the gap Op as a path, thereby causing failure.

As shown in FIGS. 28A and 28B, by using a long-hole shape as the hole shape of the housing 17 to which the electrical contactor 90 is to be attached, interference of the corner E of the first plunger 91 with the housing 17 can be suppressed. Further, the gap Op between the housing 17 and the first plunger 91 can be blocked. However, as described above, forming a long-hole shape causes a problem of cost increase.

This invention has been made in view of the aforementioned problem. This invention is intended to provide an electrical contactor and an electrical connecting apparatus capable of enhancing performance of physical contact with an electrode and capable of avoiding electrical contact failure at low cost.

Solution to Problem

To solve the aforementioned problem, an electrical contactor according to a first aspect of this invention includes: (1) a first plunger to contact one member, the first plunger including a tip portion formed into a plurality of chevron shapes; (2) a second plunger to contact a counterpart member, the second plunger contacting the first plunger while overlapping a portion of the first plunger and working in cooperation with the first plunger to form electrical conduction between the one member and the counterpart member; and (3) a spring part to couple the tip portion of the first plunger and a tip portion of the second plunger while the tip portion of the first plunger and the tip portion of the second plunger are pointed in opposite directions. The spring part covers an outer periphery of a part where the first plunger and the second plunger are coupled. The spring part abuts on a receiving portion of each of the first plunger and the second plunger, thereby supporting the first plunger and the second plunger in a manner that allows the first plunger and the second plunger to slide relative to each other.

An electrical connecting apparatus according to a second aspect of this invention is an electrical connecting apparatus to contact an electrode of a device under test to conduct a test. The electrical connecting apparatus includes a plurality of electrical contactors provided in positions corresponding to electrodes of the device under test. Each of the electrical contactors causes a current to pass through by contacting a corresponding one of the electrodes. The electrical contactor as recited in any one of claims 1 to 8 is used as each of the electrical contactors of the electrical connecting apparatus.

This invention is capable of enhancing performance of physical contact with an electrode and capable of avoiding electrical contact failure at low cost.

BRIEF DESCRIPTION OF THE DRAWINGS

FIG. 8 is a plan view showing a tip shape of the first plunger according to the first embodiment;

Figure 1:
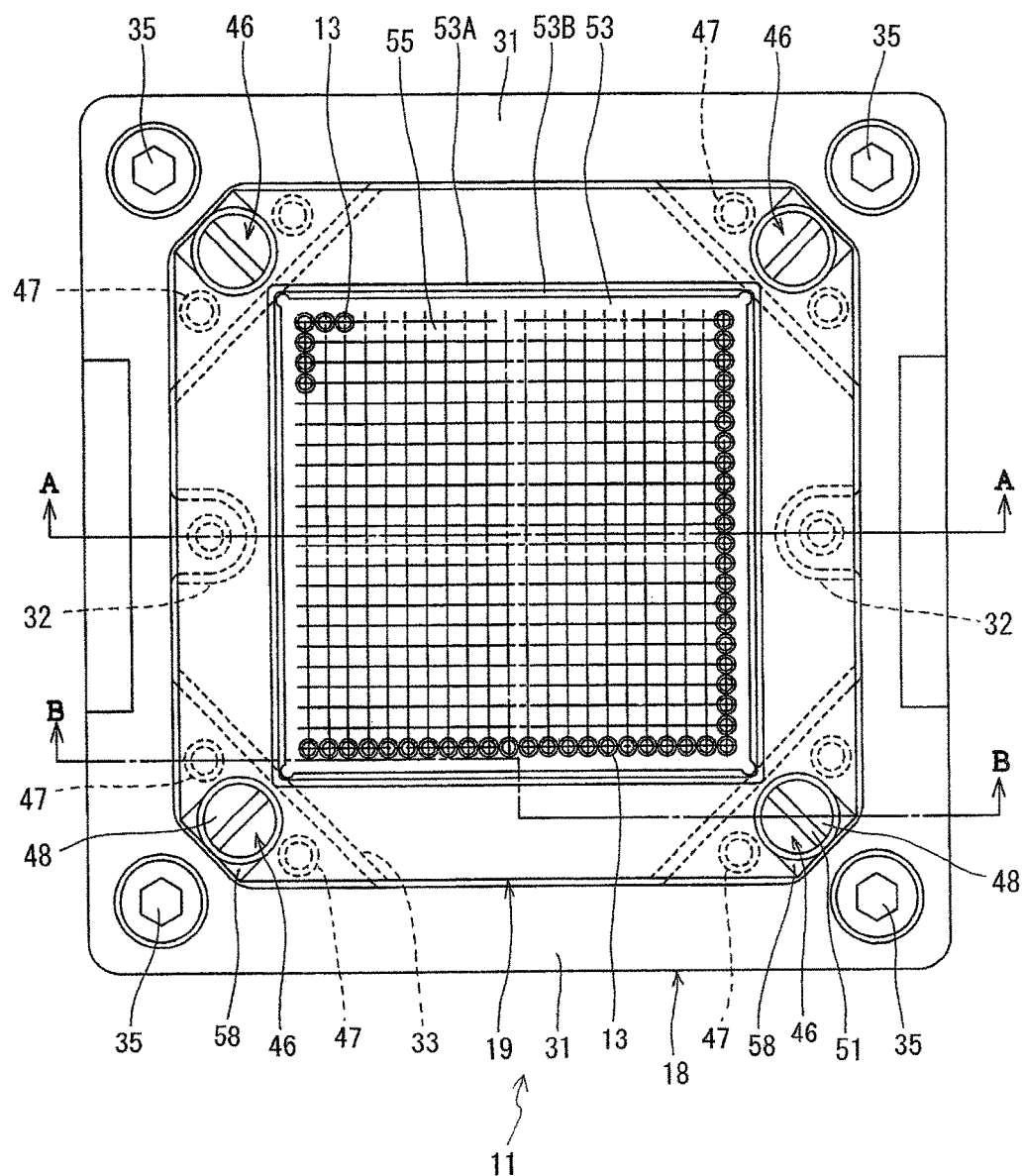
FIG. 1 is a plan view showing an electrical connecting apparatus according to a first embodiment.

DETAILED DESCRIPTION OF THE PREFERRED EMBODIMENTS (A) First Embodiment

A first embodiment of an electrical contactor and an electrical connecting apparatus according to this invention will be described below in detail by referring to the drawings.

(A-1) Detailed Structure of Electrical Connecting Apparatus

FIG. 1 is a plan view showing an electrical connecting apparatus 11 according to a first embodiment.

Figure 2:
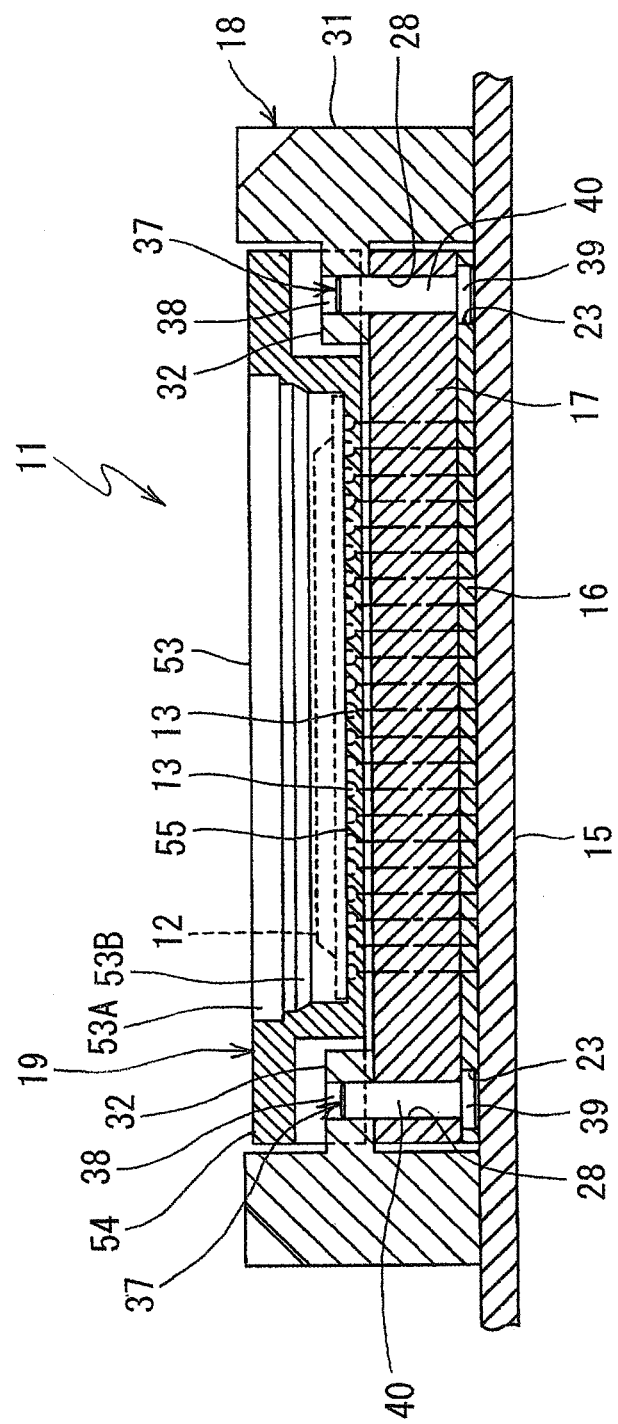
FIG. 2 is a sectional view taken along an arrow line A-A of FIG. 1 showing the electrical connecting apparatus according to the first embodiment.

FIG. 2 is a sectional view taken along an arrow line A-A of FIG. 1 showing the electrical connecting apparatus 11 according to the first embodiment.

Figure 3:
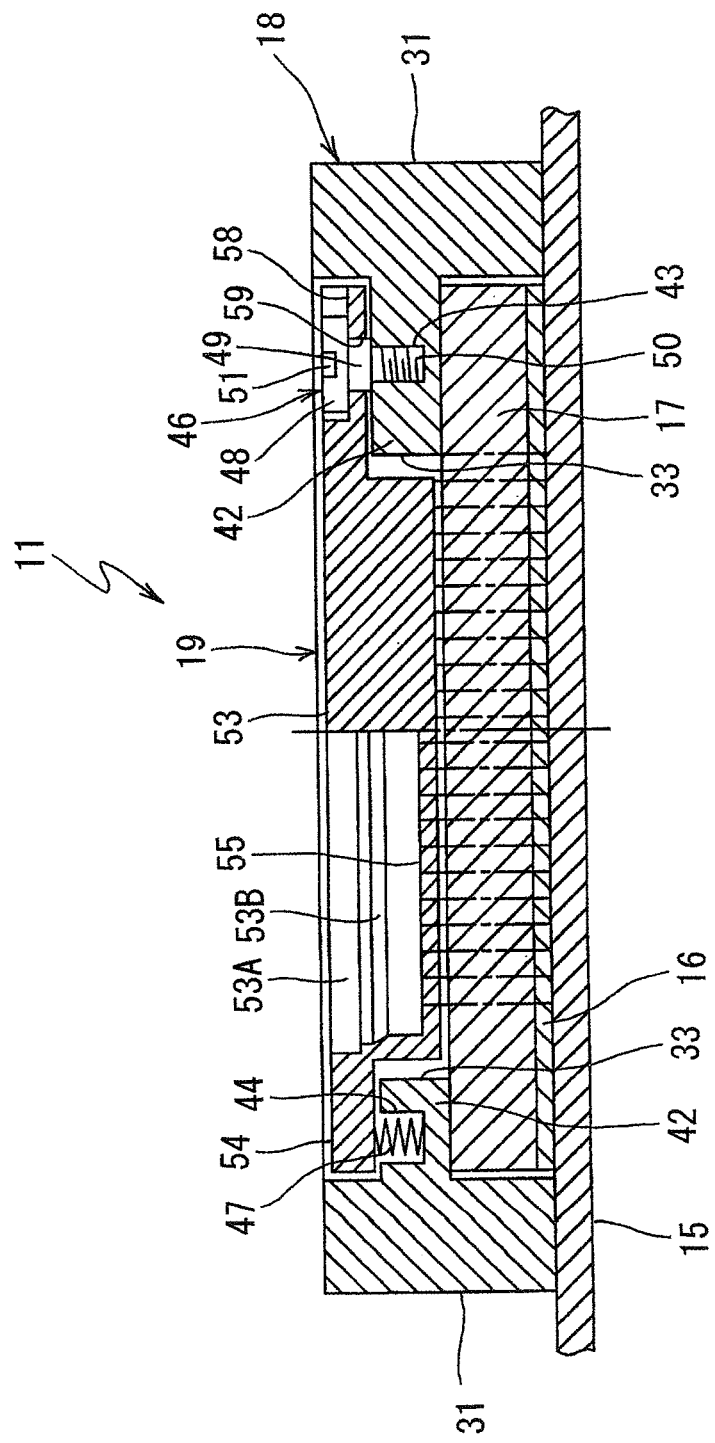
FIG. 3 is a sectional view taken along an arrow line B-B of FIG. 1 showing the electrical connecting apparatus according to the first embodiment.

FIG. 3 is a sectional view taken along an arrow line B-B of FIG. 1 showing the electrical connecting apparatus 11 according to the first embodiment.

The structure of an inspection device including the electrical connecting apparatus 11 using an electrical contactor according to the first embodiment will be described first in detail by referring to FIGS. 1 to 3.

The inspection device includes an electrical connecting apparatus to conduct an electrical current test, etc. on a device under test 12 (see FIG. 2). The inspection device is also called a prober.

The device under test 12 is a semiconductor device such as an integrated circuit, for example. The device under test 12 is provided with a plurality of electrodes 13 (see FIG. 2) arranged on the lower surface of the device under test 12. A surface of each electrode 13 is described as a spherical surface, for example. The electrodes 13 are arranged on the lower surface of the device under test 12 in one row, in a plurality of rows, or in a matrix, for example.

Referring to FIG. 3, the electrical connecting apparatus 11 mainly includes a wiring substrate 15, a lower housing 16, an upper housing 17, a frame 18, and a guide plate 19.

The wiring substrate 15 includes a wiring line such as a signal line leading to an electrical contactor 20. Further, the wiring substrate 15 supports the lower housing 16, the upper housing 17, etc. The wiring substrate 15 is a member to form an electrode belonging to the inspection device. The wiring line of the wiring substrate 15 is connected to a wiring line of the inspection device for purpose such as implementation of a test by the inspection device. A contact pad 22 (see FIG. 4) is provided on the upper surface of the wiring substrate 15. A lower end portion of the electrical contactor 20 contacts the contact pad 22 to achieve electrical conduction between the contact pad 22 and the device under test 12 via the electrical contactor 20.

The lower housing 16 and the upper housing 17 are electrical contactor support members to support a large number of electrical contactors 20.

As described later, the lower housing 16 is provided with a large number of first support holes 16A (see FIG. 4) into which a lower end portion of each of a large number of electrical contactors 20 is inserted. By inserting each electrical contactor 20 into the first support hole 16A, the large number of electrical contactors 20 are supported by the lower housing 16.

The number of the first support holes 16A is set in a manner that depends on the number of electrodes 13 provided to the device under test 12. The shape of each first support hole 16A is set as a circular shape, for example.

The lower housing 16 is overlaid on the wiring substrate 15 from above. The contact pad 22 on the upper surface of the wiring substrate 15 is arranged below the large number of first support holes 16A. Thus, downwardly pressing each electrical contactor 20 inserted into a corresponding first support hole 16A makes this electrical contactor 20 electrically contact the contact pad 22.

The lower housing 16 includes a pin head fitting hole 23 to be fitted to a head 39 of a guide pin 37. To prevent play of the head 39 of the guide pin 37, the inner diameter of the pin head fitting hole 23 is substantially the same as the outer diameter of the head 39 of the guide pin 37 (see FIG. 2).

The upper housing 17 is arranged above the lower housing 16. As described below, the upper housing 17 is provided with a large number of second support holes 17A (see FIG. 4) into which an upper portion of each of the large number of electrical contactors 20 is inserted.

The large number of second support holes 17A are provided in positions corresponding to the respective positions of the large number of first support holes 16A of the lower housing 16. Specifically, the electrical contactor 20 is supported by being inserted into the first support hole 16A and the second support hole 17A. The second support hole 17A has an inner diameter same as the diameter of the upper opening of the first support hole 16A.

The electrical contactor 20 can expand and contract in a vertical direction between the upper housing 17 and the lower housing 16. In other words, the electrical contactor 20 inserted into the first support hole 16A and the second support hole 17A can slide in a vertical direction.

The upper housing 17 includes a pin shaft fitting hole 28 (see FIG. 2). The pin shaft fitting hole 28 is a hole in which a shaft 40 of the guide pin 37 is to be fitted. To prevent play of the shaft 40 of the guide pin 37, the inner diameter of the pin shaft fitting hole 28 is substantially the same as the outer diameter of the shaft 40 of the guide pin 37.

The frame 18 is for fixing the wiring substrate 15, the lower housing 16, and the upper housing 17 integrally and supporting the wiring substrate 15, the lower housing 16, and upper housing 17. The frame 18 supports the guide plate 19 movable in a vertical direction.

As shown in FIGS. 1 to 3, the frame 18 includes an outer frame part 31, a fixing flange part 32, and a vertical movement supporting flange part 33.

The outer frame part 31 is formed into a square frame shape to surround respective marginal portions of the lower housing 16, the upper housing 17, and the guide plate 19. The lower surface of the outer frame part 31 is provided with a positioning pin or positioning hole (both of which are not shown in the drawings). The upper surface of the wiring substrate 15 is provided with a positioning hole or positioning pin (both of which are not shown in the drawings) prepared in corresponding relationship with the positioning pin or positioning hole belonging to the outer frame part 31. The positioning pin or positioning hole at the lower surface of the outer frame part 31 is fitted to the positioning hole or positioning pin at the upper surface of the wiring substrate 15. In this way, the outer frame part 31 and the wiring substrate 15 are supported in their correctly determined positions.

As shown in FIG. 1, a fixing screw 35 is attached to each of the four corners of the outer frame part 31. The fixing screw 35 is screwed into a screw hole (not shown in the drawings) of the wiring substrate 15 via a through hole (not shown in the drawings) formed at each of the four corners of the outer frame part 31. In this way, the outer frame part 31 and the wiring substrate 15 are fixed to each other.

As shown in FIGS. 1 and 2, the fixing flange part 32 includes two fixing flange parts 32 that are provided on the inner surfaces of opposite sides (frames) of an opening of the square outer frame part 31 in such a manner as to face each other. Each fixing flange part 32 is formed into a substantially semicircular plate-like shape extending inwardly and horizontally. The height of the lower surface of each fixing flange part 32 (height from the wiring substrate 15) is set to be substantially the same as a height determined by placing the lower housing 16 and the upper housing 17 one above the other. In this way, the lower housing 16 and the upper housing 17 overlaid on the wiring substrate 15 are supported by each fixing flange part 32 and the wiring substrate 15 while being caught between each fixing flange part 32 and the wiring substrate 15. More specifically, if the upper housing 17 and the lower housing 16 are placed below the fixing flange part 32, the lower surface of the lower housing 16 and the lower surface of the outer frame part 31 are arranged at the same height.

A pin hole 38 to be fitted to the guide pin 37 is formed at the center of each of the two fixing flange parts 32. The inner diameter of the pin hole 38 is set to be substantially the same as the outer diameter of the shaft 40 of the guide pin 37.

The guide pin 37 (see FIG. 2) is formed of the head 39 and the shaft 40. The head 39 is formed into a disk shape having an outer diameter substantially the same as the inner diameter of the pin head fitting hole 23 of the lower housing 16. The shaft 40 is formed into a circular rod shape having an outer diameter substantially the same as the inner diameter of the pin shaft fitting hole 28 of the upper housing 17 and the inner diameter of the pin hole 38 of the fixing flange part 32.

The pin head fitting hole 23 of the lower housing 16, the pin shaft fitting hole 28 of the upper housing 17, and the pin hole 38 of each fixing flange part 32 are arranged coaxially as these holes allow the guide pin 37 to pass through.

Thus, the head 39 of the guide pin 37 is fitted in the pin head fitting hole 23 of the lower housing 16 and the shaft 40 of the guide pin 37 is fitted in the pin shaft fitting hole 28 of the upper housing 17 and the pin hole 38 of the fixing flange part 32, thereby determining the respective positions of the lower housing 16, the upper housing 17, and the frame 18. Further, the lower housing 16 and the upper housing 17 are supported inside the opening of the frame 18 while being caught between the lower surface of each fixing flange part 32 of the frame 18 and the wiring substrate 15 from above and from below. In this way, the wiring substrate 15, the lower housing 16, the upper housing 17, and the frame 18 are fixed integrally in their correctly determined positions.

The vertical movement supporting flange part 33 (see FIG. 3) is a part for supporting the guide plate 19 inside the opening of the frame 18 in such a manner as to allow the vertical movement of the guide plate 19. The vertical movement supporting flange part 33 is formed at each of the four corners of the opening of the frame 18 having a square frame shape.

As shown in FIGS. 1 and 3, each vertical movement supporting flange part 33 includes a plate part 42, a guide screw hole 43, and a spring hole 44.

Referring to FIG. 3, the plate part 42 is a plate member hung diagonally at each of the four corners of the outer frame part 31 of the frame 18. The height of the lower surface of the plate part 42 is set to be the same as the height of the lower surface of the fixing flange part 32. The height of the upper surface of the plate part 42 is set in such a manner that abutting contact between the upper surface of the plate part 42 and the lower surface of a flange part 54 of the guide plate 19 makes the electrode 13 of the device under test 12 and an upper end portion of the electrical contactor 20 contact each other optimally. More specifically, the height of the upper surface of the plate part 42 is set in such a manner that the electrical contactor 20 is brought into a compressed position as a result of contact between the electrode 13 of the device under test 12 and the upper end portion of the electrical contactor 20.

The plate part 42 (see FIG. 3) is provided with the guide screw hole 43 and the spring hole 44. The guide screw hole 43 is a screw hole into which the guide screw 46 is screwed. The guide screw hole 43 is provided in one position at the center of each plate part 42 (see FIG. 3). The spring hole 44 is a hole in which a spring 47 is supported. The spring hole 44 includes two spring holes 44 provided on opposite sides of each guide screw hole 43.

The guide screw 46 is a screw for determining the position of the guide plate 19 in the opening of the frame 18 and for allowing the vertical movement of the guide plate 19.

As shown in FIG. 3, the guide screw 46 includes a head 48, a guide part 49, and a screw rod 50.

The head 48 is a part for retaining the guide plate 19 to prevent the guide plate 19 from falling off. The upper surface of the head 48 is provided with a recessed groove 51 in which a flat-blade screwdriver is to be fitted.

The guide part 49 is a part for guiding the vertical movement of the guide plate 19. The guide part 49 is arranged between the head 48 and the screw rod 50. The guide part 49 is fitted in a guide hole 59 of the guide plate 19 to guide the vertical movement of the guide plate 19. The length (height) of the guide part 49 is set in such a manner that, while the lower surface of the head 48 is supported as a result of contact with the guide plate 19 (while the guide plate 19 is lifted with the spring 47), the upper end portion of the electrical contactor 20 is received at a shrunk part 57 of the guide plate 19.

The screw rod 50 is a part for fixing the guide screw 46 to the plate part 42. The screw rod 50 is screwed into the guide screw hole 43 of the plate part 42 to fix the guide screw 46 to the plate part 42.

The spring 47 is a member for supporting the guide plate 19 elastically. The spring 47 is attached to the spring hole 44 of the plate part 42 to abut on the rear surface of the flange part 54 of the guide plate 19. In this way, the guide plate 19, supported by the guide parts 49 of the four guide screws 46 in such a manner as to be movable vertically, is biased from below with a total of eight springs 47. In this way, the flange part 54 of the guide plate 19 is pressed up until the flange part 54 comes into contact with the lower surface of the head 48 of the guide screw 46, thereby forming a state waiting for contact.

The guide plate 19 is a member for determining the position of the device under test 12 and supporting the device under test 12 and for aligning each electrode 13 of the device under test 12 and a corresponding electrical contactor 20 with each other during attachment of the device under test 12 to the electrical connecting apparatus 11. The guide plate 19 is formed of a receiving recess 53 and the flange part 54.

As shown in FIG. 3, the receiving recess 53 is a part in which the device under test 12 is received and supported. The receiving recess 53 is formed into a substantially square dish shape. The inner bottom of the receiving recess 53 is formed into a square shape having a dimension set to be slightly larger than the dimension of the device under test 12. In this example, the inner bottom of the receiving recess 53 is formed into a square shape to conform to the square shape of the device under test 12. If the device under test 12 has a different shape, the inner bottom of the receiving recess 53 is formed into a shape conforming to this shape of the device under test 12. In this way, the position of the device under test 12 is determined while the device under test 12 is attached to the inner bottom of the receiving recess 53.

Referring to FIG. 3, a bottom plate part 55 of the receiving recess 53 is provided with a large number of guide holes (not shown in the drawings). Each of the guide holes is an opening in which a corresponding electrode 13 of the device under test 12 is guided and received. Each of the guide holes is formed to be slightly larger than the electrode 13, so that the electrode 13 can be received easily in the guide hole. Specifically, the device under test 12 is received in the receiving recess 53 to allow each electrode 13 of the device under test 12 to be fitted easily into a corresponding guide hole through an upper side of this guide hole.

A lower end portion of each guide hole is provided with the shrunk part 57 to receive the upper end portion of the electrical contactor 20 while prohibiting the electrode 13 from passing through. The shrunk part 57 receives the upper end portion of the electrical contactor 20 and allows this upper end portion to pass through, thereby allowing contact of the electrical contactor 20 with the electrode 13.

As shown in FIG. 3, a tilted surface 53B is formed below an upper opening 53A of the receiving recess 53. The tilted surface 53B is a surface along which the device under test 12 is guided to the bottom of the receiving recess 53.

The flange part 54 is formed in a position at each of the four corners of the receiving recess 53 and corresponding to the vertical movement supporting flange part 33 of the frame 18. Each flange part 54 is provided with a counterbore 58 abutting on the head 48 of the guide screw 46. The counterbore 58 is provided with the guide hole 59 that is fitted to the guide part 49 of the guide screw 46 in such a manner as to be movable vertically. In this way, the guide hole 59 of the flange part 54 is fitted to the guide part 49 of the guide screw 46 to be movable vertically and the guide plate 19 is biased upwardly with the spring 47. By attaching the device under test 12 to the receiving recess 53 and pushing down the device under test 12 in this state, the guide plate 19 is pushed down. As a result, the electrode 13 of the device under test 12 and the upper end portion of the electrical contactor 20 come into contact with each other in preparation of an inspection.

(A-2) Detailed Description of Electrical Contactor

Figure 4:
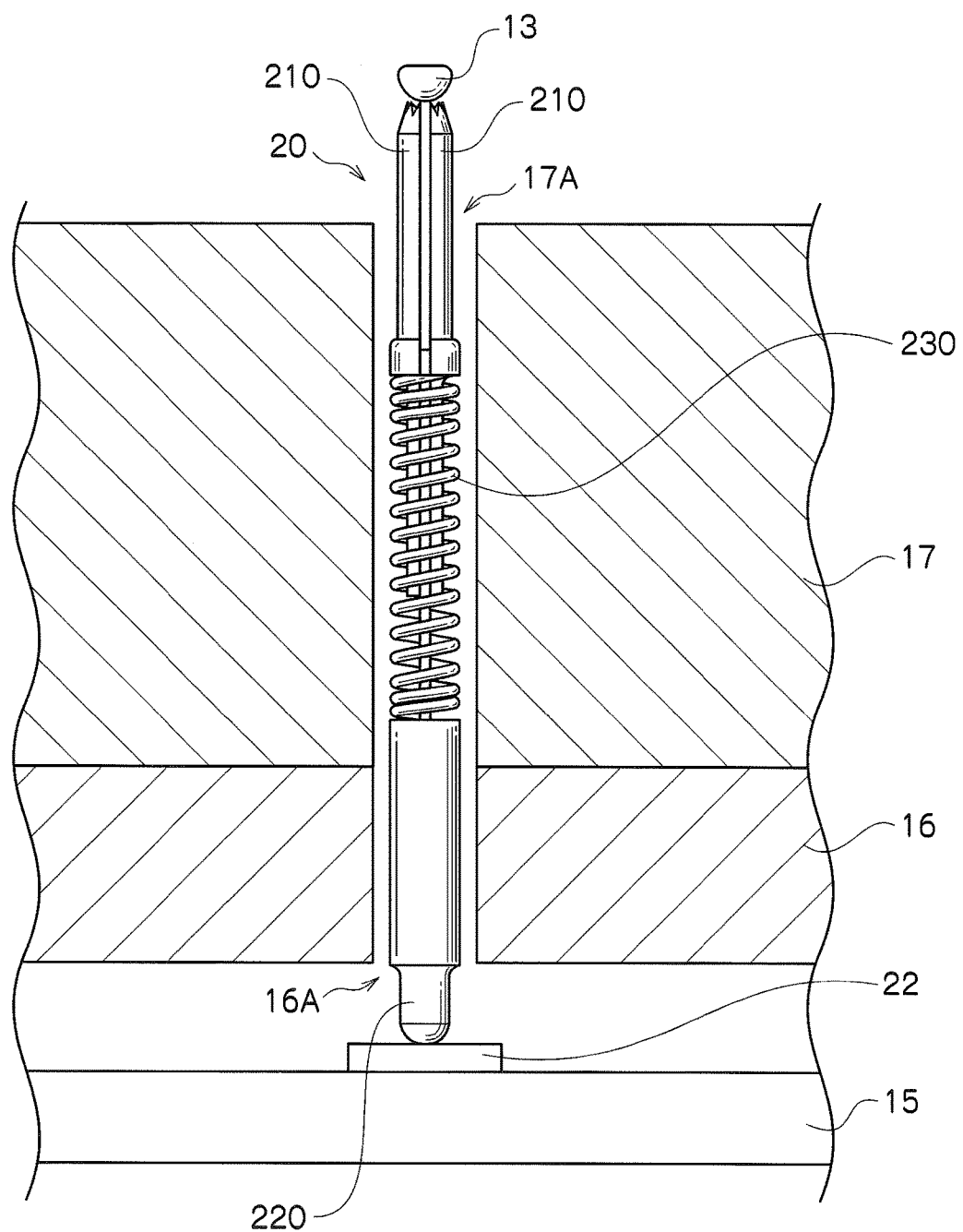
FIG. 4 is a front view showing the structure of an electrical contactor supported by an upper housing and a lower housing according to the first embodiment.

FIG. 4 is a front view showing the structure of the electrical contactor 20 supported by the upper housing 17 and the lower housing 16 according to the first embodiment.

Figure 5:
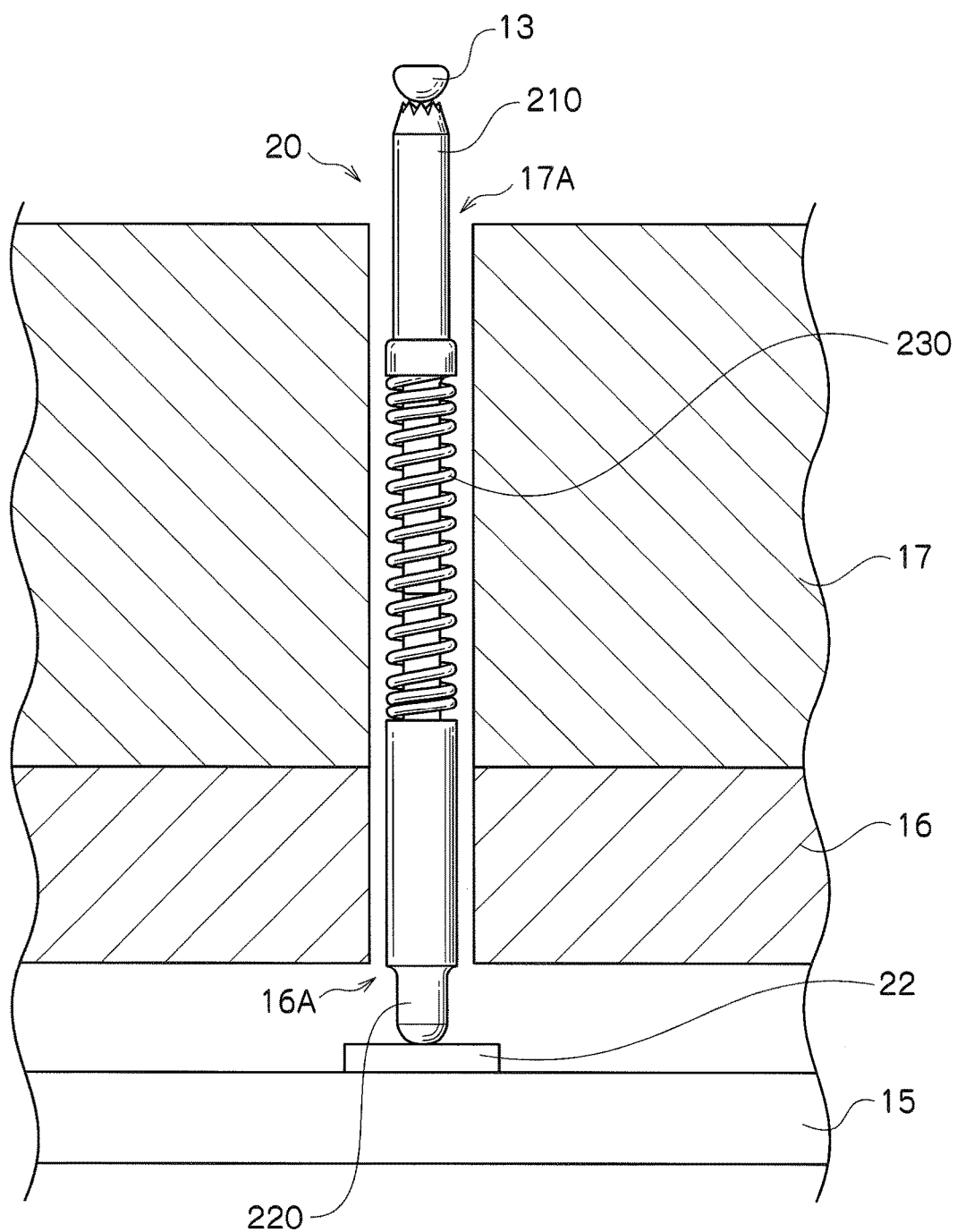
FIG. 5 is a side view showing the structure of the electrical contactor supported by the upper housing and the lower housing according to the first embodiment.

FIG. 5 is a side view showing the structure of the electrical contactor 20 supported by the upper housing 17 and the lower housing 16 according to the first embodiment.

The electrical contactor 20 includes two first plungers 210, a second plunger 220, and a spring part 230. The two first plungers 210, the second plunger 220, and the spring part 230 are each made of a conductive material.

Referring to FIGS. 4 and 5, the upper end of the electrical contactor 20 electrically contacts the electrode 13 of the device under test 12, while the lower end of the electrical contactor 20 electrically contacts the contact pad 22 on the wiring substrate 15.

In the electrical contactor 20, a lower portion of each of the two first plungers 210 is inserted into the spring part 230 and an upper portion of the second plunger 220 is inserted into the spring part 230 from a side opposite to a side of the insertion of each of the first plungers 210.

In the electrical contactor 20, the two first plungers 210 and the second plunger 220 are overlaid on each other while an upper portion of the second plunger 220 is caught between respective lower portions of the two first plungers 210. Overlaying the two first plungers 210 and the second plunger 220 achieves electrical conduction.

The spring part 230 covers the outer periphery of apart where each of the first plungers 210 and the second plunger 220 are coupled to each other. To support each of the first plungers 210 and the second plunger 220 elastically, the spring part 230 electrically contacts each of the first plungers 210 and the second plunger 220. In this way, the spring part 230 forms electrical conduction between each of the first plungers 210 and the second plunger 220.

The outer diameter of the electrical contactor 20 is smaller than the inner diameter of the second support hole 17A of the upper housing 17 and the inner diameter of the first support hole 16A of the lower housing 16. This allows the electrical contactor 20 to slide in a vertical direction when the electrical contactor 20 contacts the electrode 13 of the device under test 12 electrically.

Figure 6:
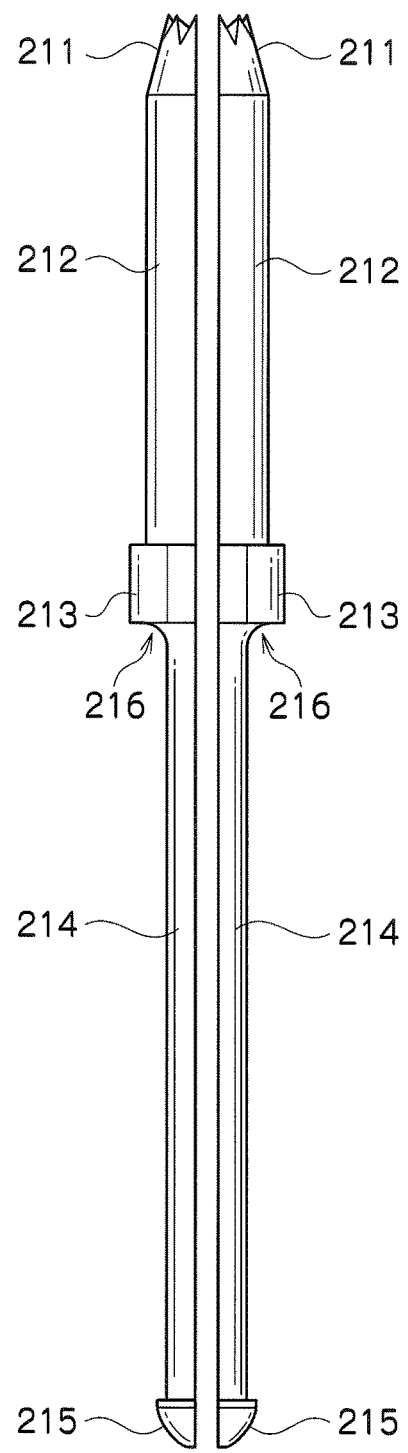
FIG. 6 is a front view showing the structure of a first plunger according to the first embodiment.

FIG. 6 is a front view showing the structure of the first plunger 210 according to the first embodiment.

Figure 7:
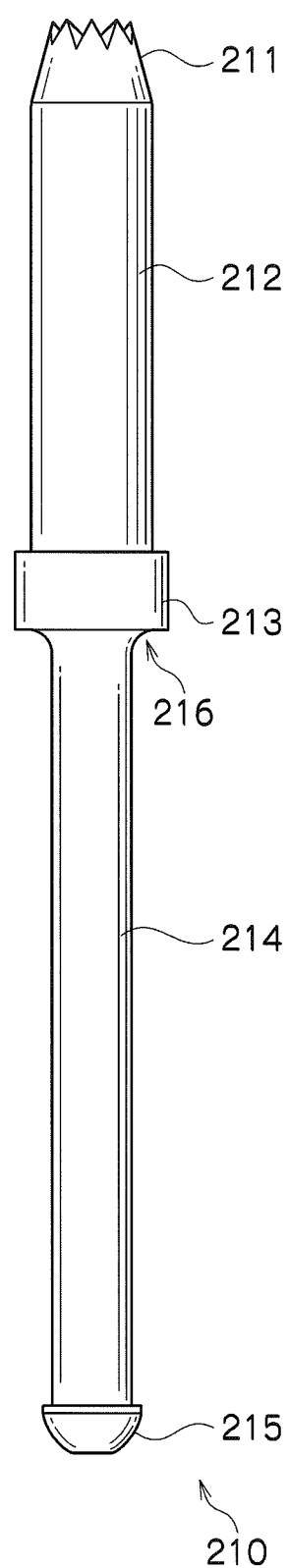
FIG. 7 is a side view showing the structure of the first plunger according to the first embodiment.

FIG. 7 is aside view showing the structure of the first plunger 210 according to the first embodiment.

FIG. 8 is a plan view showing a tip shape of the first plunger 210 according to the first embodiment.

The detailed description of the structure of the first plunger 210 will be given below by further referring to FIGS. 4 and 5, where necessary.

Referring to FIG. 6, each of the first plungers 210 has a substantially semicircular columnar shape. Each of the first plungers 210 can be formed by cutting a plunger of a substantially circular columnar shape along its center axis, for example. Thus, the two first plungers 210 are arranged in such a manner that respective planar sections of the substantially semicircular columnar first plungers 210 face each other.

The two substantially semicircular columnar first plungers 210 are to contact a surface of the electrode 13 from opposite sides. Thus, the first plungers 210 can electrically contact the electrode 13 reliably.

Forming the first plunger 210 into a substantially semicircular columnar shape makes it possible to ensure the strength of the first plunger 210. This allows the first plungers 210 to contact the electrode 13 stably. Forming the first plunger 210 into the substantially semicircular columnar shape can also respond to size reduction of the electrode 13 and the electrical contactor 20 and can respond to reduction in a pitch between the first plungers 210.

The first plunger 210 can electrically contact the electrode 13 reliably. Thus, the first plunger 210 can be made of a material (metal) not entailing high cost. For example, a conventional first plunger is plated with costly metal for enhancing electrical conduction performance. Meanwhile such plating becomes unnecessary. For better electrical conduction performance, the first plunger 210 may certainly be plated with costly metal.

As shown in FIGS. 6 and 7, the first plunger 210 includes a tip portion 211, an upper portion 212, a projecting portion 213, a coupling portion 214, and a retaining portion 215.

The tip portion 211 is to contact the electrode 13 of the device under test 12 (see FIG. 4). The tip portion 211 has a shape tapered in such a manner that the outer diameter of the tip portion 211 becomes smaller in a direction from the upper portion 212 toward the tip. The tip is formed into a plurality of chevron shapes.

As shown in FIG. 7, in a side view of the first plunger 210, the tip portion 211 is formed into a plurality of successive chevron shapes. As shown in FIG. 8, in the top view of the tip portion 211, the tip portion 211 is formed into a shape tapered from a center defined by combining the two first plungers 210 toward the top of each chevron shape. Specifically, each of these chevron shapes at the tip portion 211 has a substantially triangular prism shape and the shape of the tip portion 211 is defined by a succession of a substantially triangular prism shape and an adjacent substantially triangular prism shape.

The upper portion 212 has a substantially semicircular columnar shape. Thus, by arranging the two first plungers 210 in such a manner that the respective planar sections of the first plungers 210 face each other, the housed electrical contactor 20 is placed in a stable condition in the first support hole 16A and the second support hole 17A when the electrical contactor 20 electrically contacts the electrode 13 (see FIG. 4). Specifically, when the tip portion 211 of the first plunger 210 contacts the electrode 13, the tip portion 211 can be prevented from sliding over the surface of the electrode 13. In this way, displacement of the first plunger 210 can be prevented. Even if displacement of one of the first plungers 210 occurs, the posture of this first plunger 210 can be corrected.

Forming the tip portion 211 into a plurality of chevron shapes makes it possible to increase the number of points of contact with the electrode 13 (see FIG. 4). Even if displacement of one of the first plungers 210 occurs when the first plungers 210 contact the electrode 13, a plurality of chevron shapes at the tip portion 211 of the other first plunger 210 contacts the electrode 13 electrically to achieve electrical conduction. Specifically, contact failure can be avoided.

The respective tip portions 211 of the two first plungers 210 electrically contact the electrode 13 (see FIG. 4) in such a manner as to surround the electrode 13 to make a plurality of chevron shapes at each tip portion 211 contact the electrode 13 reliably. This can distribute a load to be applied on each of a plurality of contact points (chevron-shaped contact points) of the tip portion 211 to contact the electrode 13. This can reduce the probability of deformation, damage, etc. to be caused at the chevron shapes at the tip portion 211 when the tip portion 211 contacts the electrode 13.

By forming the first plunger 210 into the substantially semicircular columnar shape, the number of chevrons at the tip portion 211 can be increased. By increasing the number of the chevrons at the tip portion 211, points of contact with the electrode 13 can be increased. As a result, the first plunger 210 is allowed to electrically contact the electrode 13 more reliably, thereby achieving stable electrical conduction.

Figure 9A:
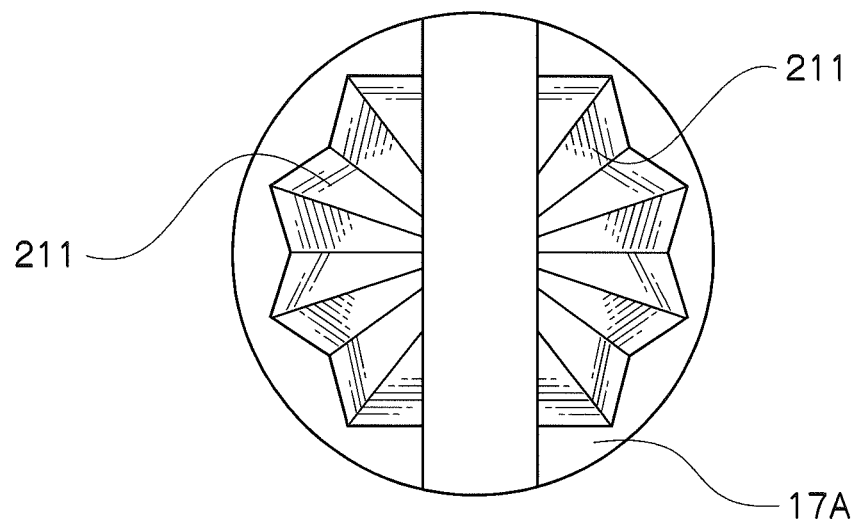
FIGS. 9A and 9B explain a relationship between a tip portion of the first plunger and a second support hole according to the first embodiment.
Figure 9B:
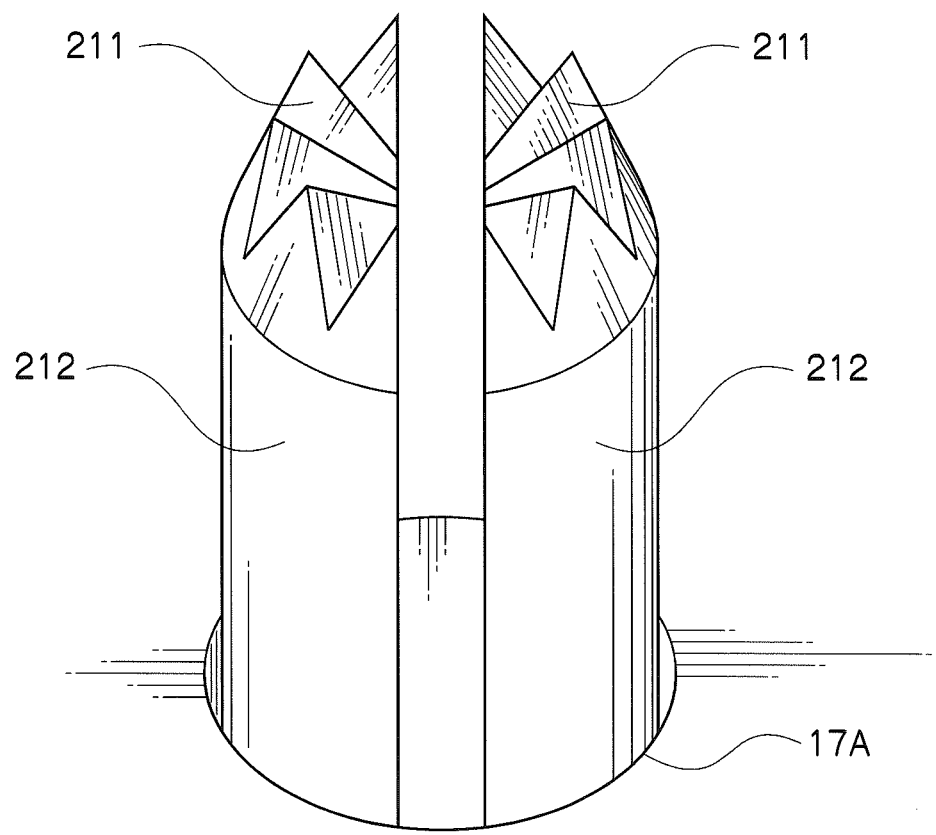

FIGS. 9A and 9B explain a relationship between the tip portion 211 of the first plunger 210 and the second support hole 17A according to the first embodiment.

FIG. 9A is a plan view of the tip portion 211 of the first plunger 210. FIG. 9B is a perspective view of the tip portion 211 of the first plunger 210.

As shown in FIGS. 9A and 9B, the upper portion 212 of the first plunger 210 protrudes from the second support hole 17A of the upper housing 17.

The upper portion 212 has a substantially semicircular columnar shape. Thus, a marginal gap between the first plunger 210 and the second support hole 17A can be blocked. This can interrupt a droplet path (gap) through which droplets resulting from dew condensation are to drip down if the electrical connecting apparatus 11 is used in a low-temperature environment.

As a result of the substantially semicircular columnar shape of the upper portion 212 of the first plunger 210, interference between a corner of the first plunger and the second support hole can be suppressed, unlike in the case of a conventional plate-like plunger. This eliminates residue of cutting that might be caused due to the interference between the corner and the second support hole. As a result, contact failure can be avoided. Further, the second support hole 17A of the upper housing 17 and the first support hole 16A of the lower housing 16 are not required to be formed into a long-hole shape, thereby allowing cost reduction.

Referring to FIG. 6, the projecting portion 213 has a substantially semicircular columnar shape. The outer diameter of the projecting portion 213 is larger than the outer diameter of the upper portion 212. The projecting portion 213 includes a receiving portion 216 formed between the projecting portion 213 and the coupling portion 214 that is arranged below the projecting portion 213 to be continuous with this projecting portion 213.

The receiving portion 216 is to receive an end portion of the spring part 230 (see FIG. 4). The receiving portion 216 is formed into a tapered shape with an outer diameter increasing in a direction from the coupling portion 214 toward the projecting portion 213. The receiving portion 216 of this embodiment is described as having the tapered shape. The receiving portion 216 may alternatively be formed as a step, for example, as long as the end portion of the spring part 230 can be received at the receiving portion 216.

The coupling portion 214 has a substantially semicircular columnar shape. The coupling portion 214 contacts a coupling portion 222 (see FIG. 10) provided at an upper portion of the second plunger 220 at a planar section of its substantially semicircular columnar shape. The outer diameter of the coupling portion 214 is smaller than the outer diameter of the upper portion 212. This setting is made for reason of allowing the first plunger 210 and the second plunger 220 to slide in a vertical direction in response to the elastic force of the spring part 230 acting when the coupling portion 214 to electrically contact the second plunger 220 is inserted into the inside of the spring part 230 (see FIG. 4).

The retaining portion 215 is to prevent the first plunger 210 inserted into the inside of the spring part 230 from falling off. The retaining portion 215 has a substantially semicircular columnar projecting shape larger than the outer diameter of the coupling portion 214. To guide insertion of the coupling portion 214 into the inside of the spring part 230 (see FIG. 4), a surface of the retaining portion 215 is curved and tilted.

Figure 10:
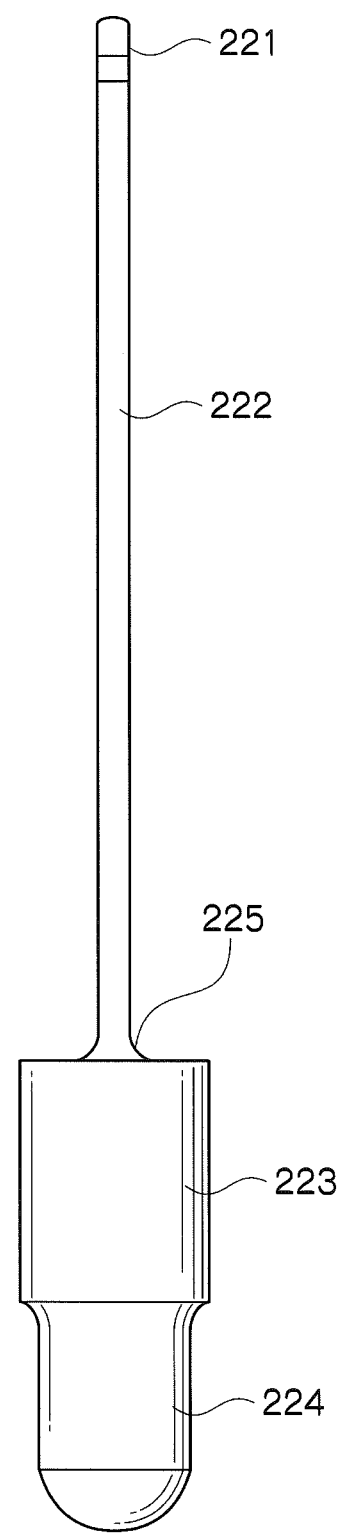
FIG. 10 is a front view showing the structure of a second plunger according to the first embodiment.

FIG. 10 is a front view showing the structure of the second plunger 220 according to the first embodiment.

Figure 11:
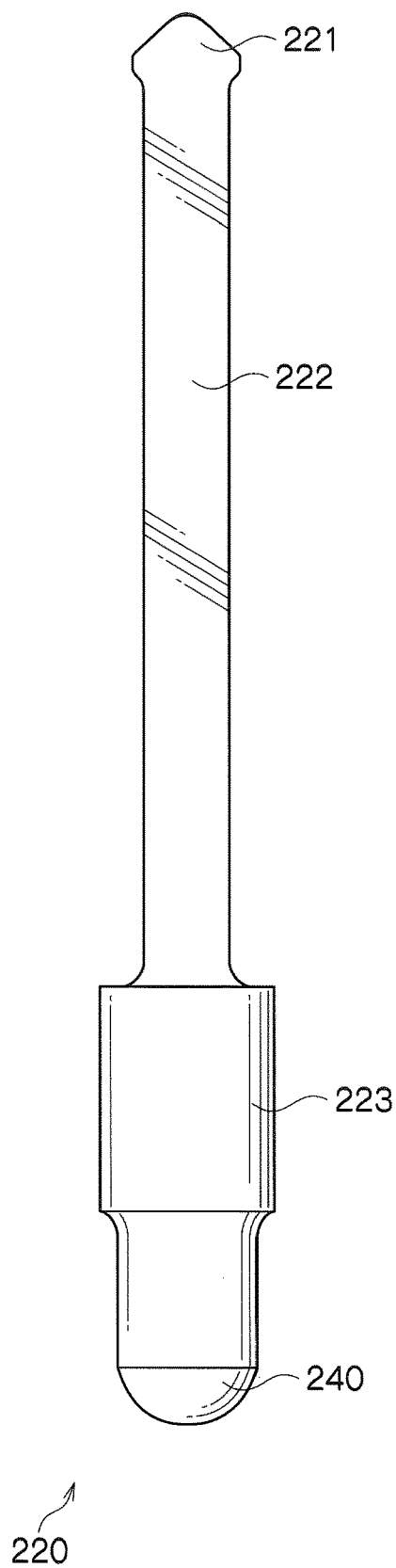
FIG. 11 is a side view showing the structure of the second plunger according to the first embodiment.

FIG. 11 is a side view showing the structure of the second plunger 220 according to the first embodiment.

The detailed description of the structure of the second plunger 220 will be given below by further referring to FIGS. 4 to 7, where necessary.

The second plunger 220 is electrically connected to each of the first plungers 210 to form electrical conduction with a lower end portion of the second plunger 220 electrically contacting the contact pad 22 (see FIG. 4) on the wiring substrate 15 and the upper portion of the second plunger 220 being caught between the two first plungers 210 (see FIG. 4).

The second plunger 220 is formed by processing a conductive material by means of cutting, pressing, and plating using photolithography technique, for example.

Referring to FIGS. 10 and 11, the second plunger 220 includes a tip portion 221, the coupling portion 222, a lower portion 223, and a lower end portion 224.

The coupling portion 222 and the tip portion 221 are each formed into a plate-like shape. The coupling portion 222 and the tip portion 221 overlap the respective planar sections of the coupling portions 214 of the two first plungers 210 to electrically contact the coupling portions 214.

The tip portion 221 is to guide insertion of the coupling portion 222 into the inside of the spring part 230 (see FIG. 4). In order not to become an obstacle to the insertion of the coupling portion 222 into the spring part 230, a surface of the tip portion 221 is curved and tilted.

The width value (dimension) of the coupling portion 222 may be set to be substantially the same as or slightly smaller than the width value of the planar section of the coupling portion 214 of the first plunger 210 (see FIG. 7). By doing so, an area of electrical contact between the coupling portion 222 of the second plunger 220 and the coupling portion 214 of the first plunger 210 can be increased, thereby achieving favorable electrical conduction.

The lower portion 223 has a substantially circular columnar shape. The outer diameter of the lower portion 223 can be substantially the same as the outer diameter of the projecting portion 213 (see FIGS. 6 and 7) of the first plunger 210. The lower portion 223 includes a receiving portion 225 provided between the lower portion 223 and the coupling portion 222 to receive an end portion of the spring part 230 (see FIG. 4).

As long as the spring part 230 can be received at the receiving portion 225, the diameter of the receiving portion 225 passing through the center axis of the receiving portion 225 can be larger than the width value of the coupling portion 222.

The lower end portion 224 electrically contacts the contact pad 22 (see FIG. 4) on the wiring substrate 15. The outer diameter of the lower end portion 224 may substantially be the same as or smaller than the outer diameter of the lower portion 223.

Figure 12:
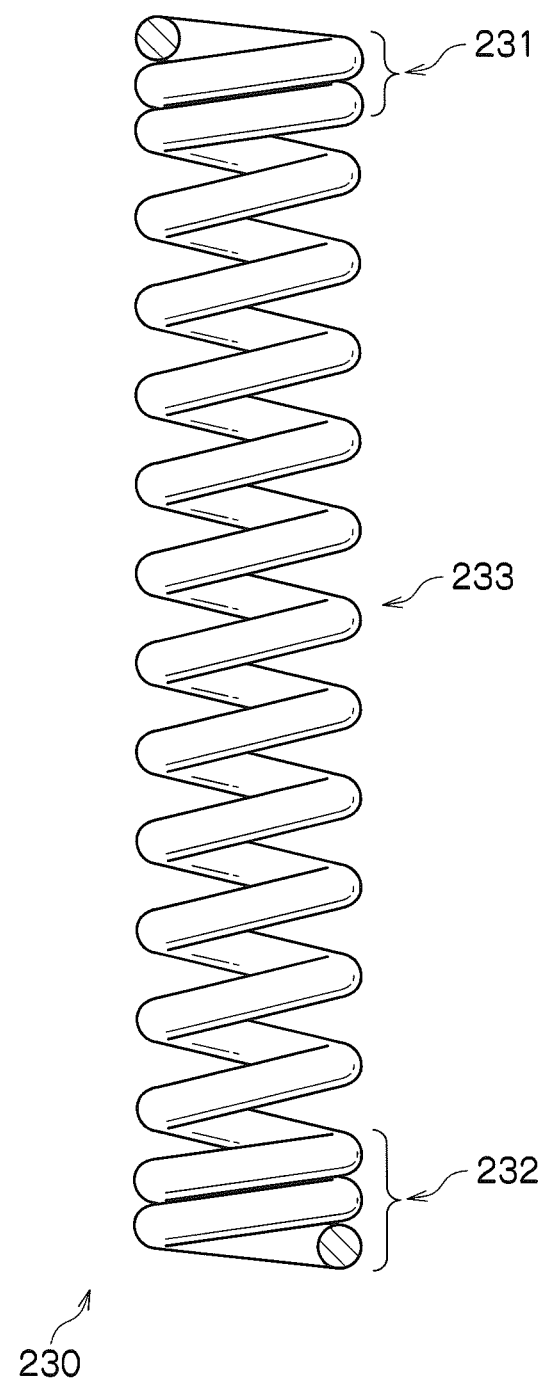
FIG. 12 shows the structure of a spring part according to the first embodiment.

FIG. 12 shows the structure of the spring part 230 according to the first embodiment. The detailed description of the structure of the spring part 230 will be given below by further referring to FIGS. 4 to 7, 10, and 11, where necessary.

The spring part 230 is a compressed coil spring made of a conductive material. With the coupling portion 222 of the second plunger 220 (see FIGS. 4 and 10) being caught between the respective coupling portions 214 of the two first plungers 210 (see FIGS. 4 and 6), the spring part 230 covers the outer peripheries of the coupling portions 214 and the outer periphery of the coupling portion 222 and contacts the respective receiving portions 216 of the two first plungers 210 and the receiving portion 225 of the second plunger 220. In this way, the spring part 230 elastically supports each of the first plungers 210 and the second plunger 220.

The spring part 230 contacts each of the first plungers 210 and the second plunger 220. Thus, the spring part 230 itself is electrically conducting. While covering a part where the coupling portion 214 of each of the first plungers 210 and the coupling portion 222 of the second plunger 220 are coupled in such a manner as to overlap each other, the spring part 230 elastically supports each of the first plungers 210 and the second plunger 220 in a manner that allows each of the first plungers 210 and the second plunger 220 to move in a vertical direction relative to each other.

The spring part 230 is a wire material of a diameter of about several microns. To make the spring part 230 exert elastic force in a vertical direction, the spring part 230 is formed into a coil spring having about 10 to about 20 turns, for example.

The spring part 230 includes an upper end portion 231 and a lower end portion 232 that are to contact (abut on) the receiving portion 216 of each of the first plungers 210 and the receiving portion 225 of the second plunger 220 respectively.

The spring part 230 includes an intermediate portion 233 having an outer diameter set to be substantially the same as or slightly larger than the maximum width dimension of the first plunger 210 and that of the second plunger 220. In other words, the outer diameter of the intermediate portion 233 is set to be substantially the same as or slightly larger than the outer diameter of the projecting portion 213 of the first plunger 210 and the outer diameter of the lower portion 223 of the second plunger 220. This setting is intended to allow the first plunger 210 and the second plunger 220 to slide in a vertical direction.

Meanwhile, each of the upper end portion 231 and the lower end portion 232 of the spring part 230 is formed by winding the wire material tightly into about two or three turns, for example, so as to support the part where the coupling portion 214 of each of the first plungers 210 and the coupling portion 222 of the second plunger 220 overlap each other. Thus, the inner diameter of each of the upper end portion 231 and the lower end portion 232 is set to be smaller than the inner diameter of the intermediate portion 233.

Specifically, the inner diameter of each of the upper end portion 231 and the lower end portion 232 is set to be slightly smaller than the diameter of a circumcircle circumscribed around a cross-sectional shape of the respective coupling portions 214 of the two first plungers 210 holding the coupling portion 222 of the second plunger 220 therebetween. In other words, the upper end portion 231 and the lower end portion 232 of the spring part 230 each function as a tight small-diameter portion.

Figure 13A:
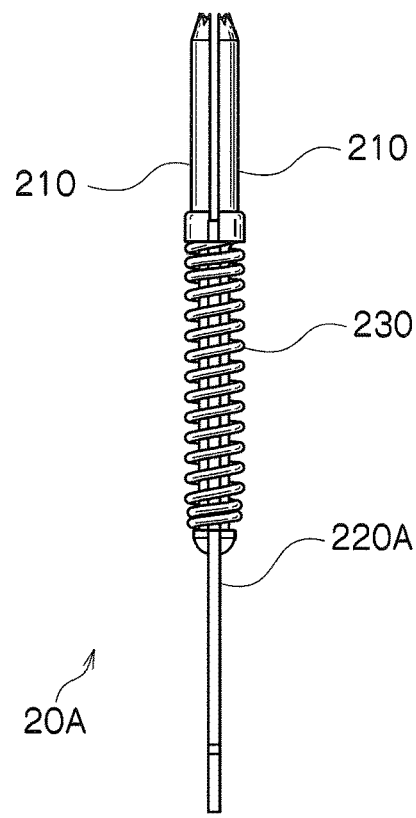
FIGS. 13A and 13B show the structure of an electrical contactor according to a modified embodiment of the first embodiment.
Figure 13B:
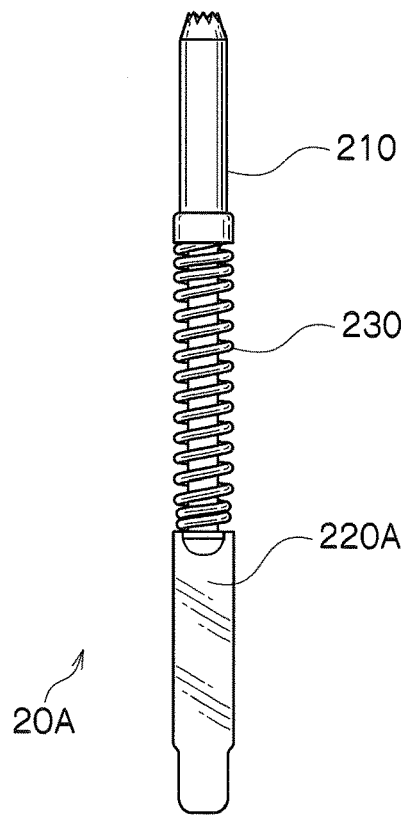

(A-3) Modified Embodiment of First Embodiment (A-3-1) Modified Embodiment of Second Plunger FIG. 13A is a front view of an electrical contactor 20A according to a modified embodiment of the first embodiment. FIG. 13B is a side view of the electrical contactor 20A according to the modified embodiment of the first embodiment.

Figure 14:
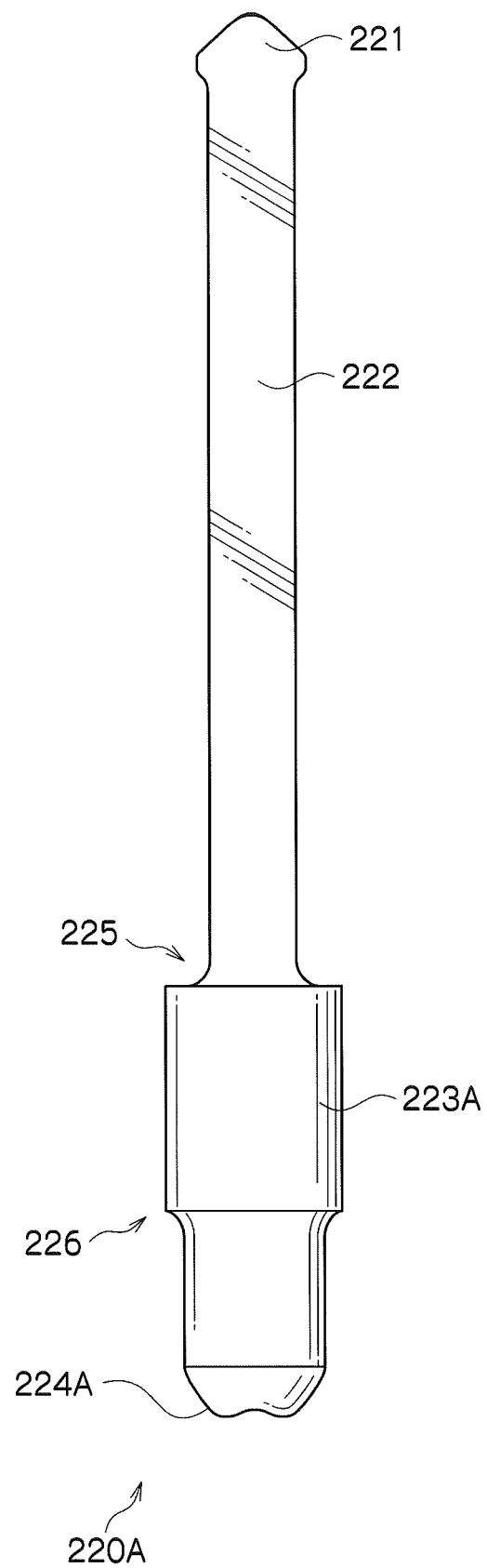
FIG. 14 is a side view showing a second plunger according to the modified embodiment of the first embodiment.

FIG. 14 is a side view of a second plunger 220A according to the modified embodiment of the first embodiment.

In the aforementioned first embodiment, regarding the second plunger 220 of the electrical contactor 20, each of the lower portion 223 and the lower end portion 224 is described as having a substantially circular columnar shape and the coupling portion 222 is described as having a plate-like shape, as shown in FIGS. 10 and 11.

Meanwhile, the electrical contactor 20 may include the second plunger 220A formed into a plate-like shape instead of the second plunger 220.

As shown in FIGS. 13A, 13B, and 14, the second plunger 220A is a plate-like plunger. The second plunger 220A can be formed by processing one plate-like conductive material by means of pressing, cutting, and plating, for example.

Using the plate-like second plunger 220A instead of the second plunger 220 according to the first embodiment can provide an electrical contactor at lower cost.

The electrical contactor 20A according to the modified embodiment includes the two first plungers 210 according to the first embodiment. Thus, like in the first embodiment, the electrical contactor 20A can electrically contact the electrode 13 of the device under test 12 (see FIG. 4) more reliably and interference of the electrical contactor 20A with the second support hole 17A (see FIG. 4) as a housing can be suppressed. Further, a droplet path between the electrical contactor 20A and the second support hole 17A can be interrupted.

As shown in FIG. 14, the second plunger 220A includes a tip portion 221, a coupling portion 222, a lower portion 223A, and a lower end portion 224A.

The tip portion 221 and the coupling portion 222 are structures same as or comparable to the corresponding structures of the second plunger 220 according to the first embodiment.

The lower portion 223A has a substantially rectangular plate-like shape. The lower portion 223A is provided integrally with the coupling portion 222 and continuous with a base end side (lower side) of the coupling portion 222. The width value (width dimension) of the lower portion 223A is smaller than the inner diameter of the first support hole 16A of the lower housing 16 and the inner diameter of the second support hole 17A of the upper housing 17 (see FIG. 4). The receiving portion 225 to receive an end portion of the spring part 230 is formed at a boundary between the lower portion 223A and the coupling portion 222.

The lower end portion 224A electrically contacts the contact pad 22 (see FIG. 4) on the wiring substrate 15. The lower end portion 224A is provided continuously and integrally with the lower portion 223A. The width value (width dimension) of the lower end portion 224A is smaller than the width value (width dimension) of the substantially-rectangular lower portion 223A. Further, the lower end of the lower end portion 224A is curved so as to electrically contact the contact pad 22 stably and reliably.

A lower support shoulder portion 226 is formed at a boundary between the lower portion 223A and the lower end portion 224A. The lower support shoulder portion 226 is intended to make the lower portion 223A get caught on the lower housing 16, thereby preventing the lower portion 223A from falling off the first support hole 16A (see FIG. 4).

As described above, the electrical contactor 20A can be formed by using the second plunger 220A of FIG. 14 instead of the second plunger 220 according to the first embodiment.

(A-3-2) In the aforementioned first embodiment, the tip portion 211 of the first plunger 210 of FIGS. 6 to 8 is illustrated as having a plurality of chevron shapes.

The number of chevron shapes formed at the tip portion 211 is not particularly limited. Meanwhile, it is desirable that a larger number of chevron shapes be formed at the tip portion 211 in order for the chevron shapes to contact the electrode 13 of the device under test 12 at a larger number of points to electrically contact the electrode 13 reliably. In the first embodiment, five chevron shapes are formed at the tip portion 211, for example. However, the number of chevron shapes at the tip portion 211 may be three or four, or six or more, for example.

The angle of the top of a chevron shape on the outer peripheral surface of the tip portion 211 changes in a manner that depends on the number of chevron shapes at the tip portion 211. It is desirable that the angle of the top of a chevron shape be from several degrees to several tens of degrees. In consideration of deformation or wear of a chevron shape that might be caused by a load on the chevron shape as a result of electrical contact of the chevron shape with the electrode 13, it is preferable that the angle of the top of the chevron shape be from about 45 to about 50 degrees.

A span between the tips of chevrons (distance between a chevron shape of one of the first plungers 210 and a chevron shape of the other of the first plungers 210 facing the former chevron shape) is determined in a manner that depends on the dimension of the electrode 13 and is desirably from about several hundreds of micrometers to about several millimeters, for example. It is also desirable that the length of the tip portion 211 in the height direction of a chevron shape be about several tens of micrometers. These settings are made for reason of allowing the first plunger 210 to electrically contact the ball-shaped electrode 13 reliably.

(A-4) Advantageous Effect of First Embodiment

As described above, according to the first embodiment, the two substantially semicircular columnar first plungers 210 are to contact a surface of the electrode from opposite sides. Thus, the first plungers 210 can electrically contact the electrode 13 reliably while cost for manufacturing the electrical contactor is reduced.

By forming the first plunger into a substantially semicircular columnar shape, the strength of the first plunger to contact an electrode can be ensured. This can respond to size reduction of the electrical contactor and can respond to reduction in a pitch between the first plungers.

The tip portion of the first plunger has a plurality of chevron shapes to make one first plunger contact an electrode at multiple points. Thus, even if the first plunger is displaced, electrical contact with the electrode can still be achieved.

The substantially semicircular columnar shape of the first plunger can suppress interference of the first plunger with the second support hole in which the electrical contactor is housed. This can suppress residue of cutting that might be caused due to the interference. Further, as a result of the substantially semicircular columnar shape of the first plunger, a droplet path between the electrical contactor and the first support hole, and a droplet path between the electrical contactor and the second support hole can be interrupted. As a result, contact failure can be avoided.

(B) Second Embodiment

A second embodiment of the electrical contactor and the electrical connecting apparatus according to this invention will be described below in detail by referring to the drawings.

An electrical contactor according to the second embodiment has a structure differing from the aforementioned structure of the electrical contactor according to the first embodiment. An electrical connecting apparatus according to the second embodiment can be the same as or comparable to the electrical connecting apparatus 11 according to the first embodiment shown in FIGS. 1 to 3.

Thus, the following description of the second embodiment is mainly intended for the detailed structure of the electrical contactor and the electrical connecting apparatus will not be described in detail.

(B-1) Detailed Description of Electrical Contactor

The structure of an electrical contactor 20B according to the second embodiment will be described in detail by referring to FIGS. 15A, 15B and 16.

Figure 15A:
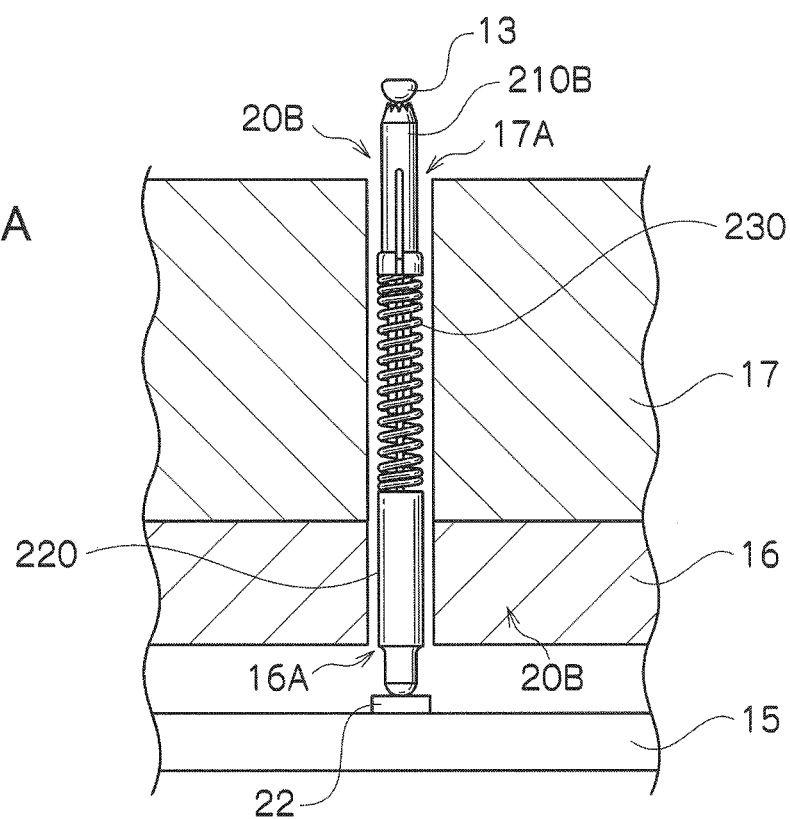
FIGS. 15A and 15B show the structure of an electrical contactor according to a second embodiment.

FIG. 15A is a front view showing the structure of the electrical contactor 20B according to the second embodiment. FIG. 15B is a side view showing the structure of the electrical contactor 20B according to the second embodiment.

Figure 16:
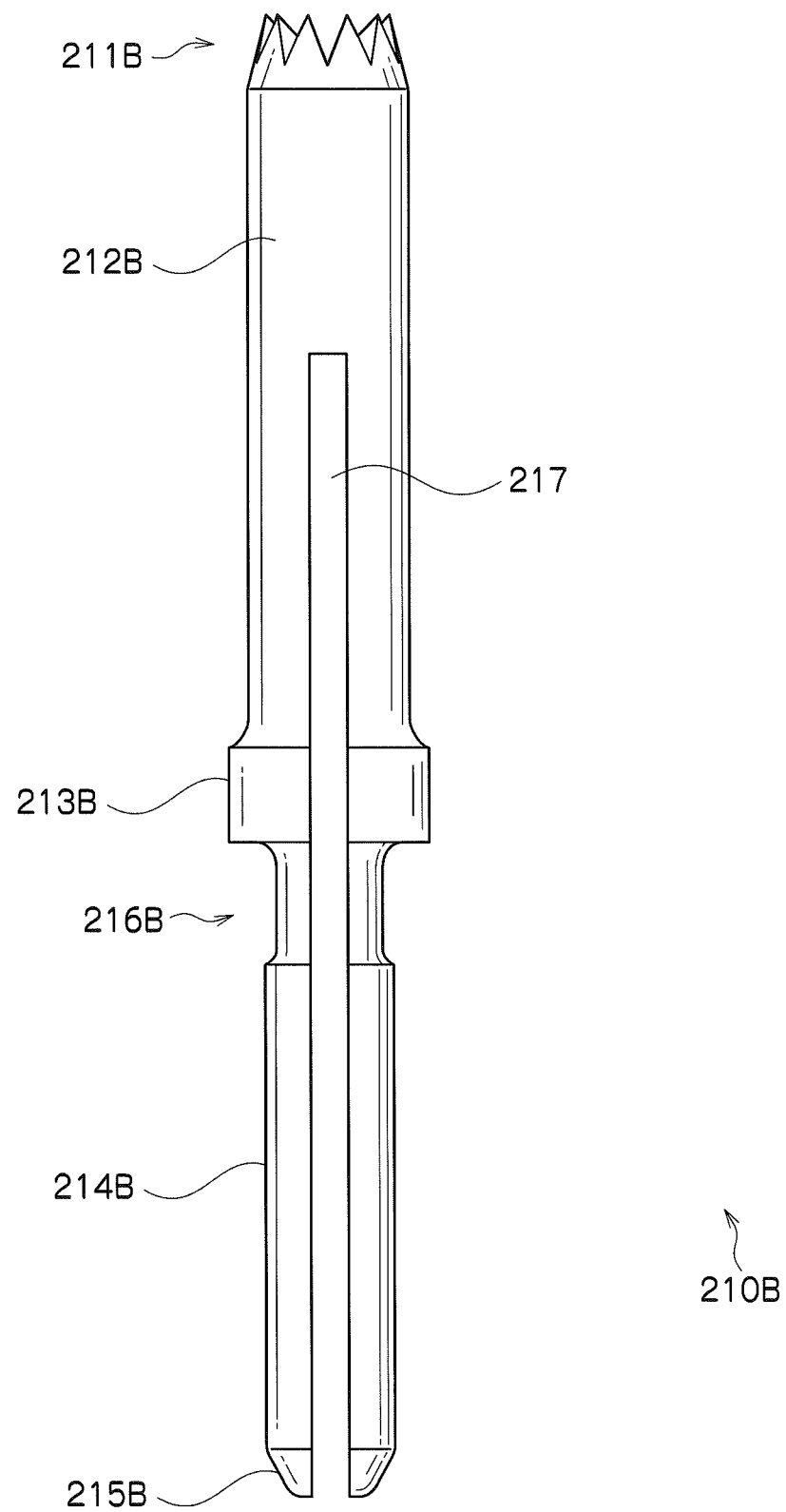
FIG. 16 is a front view showing the structure of a first plunger according to the second embodiment.

FIG. 16 is a front view showing the structure of a first plunger 210B according to the second embodiment.

The electrical contactor 20 (or 20A) according to the first embodiment is described as including two first plungers to contact the electrode 13 of the device under test 12 and one second plunger to contact the contact pad 22 on the wiring substrate 15.

By contrast, the electrical contactor 20B according to the second embodiment is described as including one first plunger to contact the electrode 13 and one second plunger to contact the contact pad 22 on the wiring substrate 15.

The electrical contactor 20B includes the first plunger 210B, a second plunger 220, and a spring part 230.

The second plunger 220 and the spring part 230 described in the first embodiment can be applied as the second plunger 220 and the spring part 230 of the second embodiment. The first plunger 210B is made of a conductive material.

One first plunger 210B of the electrical contactor 20B includes a slit formed at a lower portion of the first plunger 210B. In the electrical contactor 20B, the lower portion of the first plunger 210B is inserted into the spring part 230 and an upper portion of the second plunger 220 is inserted into the spring part 230 from a side opposite to a side of the insertion of the first plunger 210B. The upper portion of the second plunger 220 is accommodated in the slit at the lower portion of the first plunger 210B. This makes the upper portion of the second plunger 220 electrically contact the lower portion of the first plunger 210B, thereby achieving electrical conduction.

The outer diameter of the electrical contactor 20B is smaller than the inner diameter of the second support hole 17A of the upper housing 17 and the inner diameter of the first support hole 16A of the lower housing 16. This allows the electrical contactor 20B to slide in a vertical direction when the electrical contactor 20B contacts the electrode 13 of the device under test 12 electrically.

Referring to FIG. 16, the first plunger 210B includes a tip portion 211B, an upper portion 212B, a projecting portion 2133, a lower portion 214B, a lower end portion 215B, a spring retaining portion 216B, and a slit portion 217.

The first plunger 210B has a substantially circular columnar shape. The strength of the first plunger 210B can be ensured as a result of the circular columnar shape of the first plunger 210B. This allows the first plunger 210B to contact the electrode 13 (see FIGS. 15A and 15B) stably. This can also respond to size reduction of the electrode 13 and the electrical contactor 20B.

The first plunger 210B can electrically contact the electrode 13 (see FIGS. 15A and 15B) reliably. Thus, the first plunger 210B can be made of a material (metal) not entailing high cost. For example, a conventional first plunger is plated with costly metal for enhancing electrical conduction performance. Meanwhile, the tip portion 211B of the first plunger 210B is formed into a chevron shape and this allows the tip portion 211B to electrically contact the electrode 13 reliably. This eliminates plating during formation of the first plunger 210B. For better electrical conduction performance, the first plunger 210B may certainly be plated with costly metal.

The tip portion 211B is recessed at the center and is formed into a shape tapered from the center of the tip portion 211B toward the top of a chevron shape. Specifically, each of a plurality of chevron shapes at the tip portion 211B has a substantially triangular prism shape and the shape of the tip portion 211 is defined by a succession of a substantially triangular prism shape and an adjacent substantially triangular prism shape.

The tip portion 211B is recessed at the center and formed into a plurality of chevron shapes (chevron shapes like triangular prism shapes) each having a top on the outer periphery of the tip portion 211B. This allows the first plunger 210B to electrically contact the electrode 13 (see FIGS. 15A and 15B) in such a manner as to surround the electrode 13. This can also respond to pitch reduction.

Figure 15B:
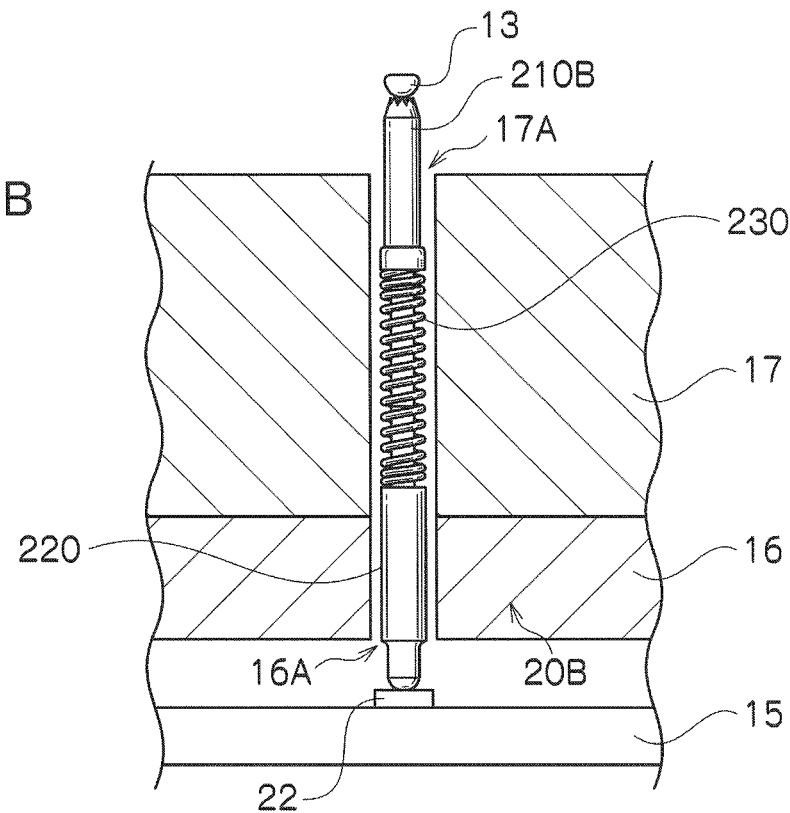

As a result of a plurality of chevron shapes at the tip portion 211B, these chevron shapes are to contact the electrode 13 (see FIGS. 15A and 15B). This can increase the number of points where the tip portion 211B contacts the electrode 13. Specifically, displacement of the first plunger can be prevented and the first plunger can contact the electrode 13 at a larger number of points, thereby achieving electrical conduction. Specifically, contact failure can be avoided.

A plurality of chevron shapes at the tip portion 211B contacts the electrode (see FIGS. 15A and 15B) reliably. This can distribute a load to be applied on each of a plurality of contact points (chevron-shaped contact points) of the tip portion 211B to contact the electrode 13. This can reduce the probability of deformation, damage, etc. to be caused at the chevron shapes at the tip portion 211B when the tip portion 211B contacts the electrode 13.

The upper portion 212B has a circular columnar shape. Thus, by housing the electrical contactor 20B in the second support hole 17A and the first support hole 16A (see FIGS. 15A and 15B), the housed electrical contactor 20B is placed in a stable condition in the first support hole 16A and the second support hole 17A.

As a result of the circular columnar shape of the upper portion 212B, a marginal gap between the first plunger 210B and the second support hole 17A can be blocked. This can interrupt a droplet path (gap) through which droplets resulting from dew condensation are to drip down if the electrical connecting apparatus 11 is used in low-temperature environment.

As a result of the circular columnar shape of the upper portion 212B, interference between a corner of the first plunger and the second support hole can be suppressed, unlike in the case of a conventional plate-like plunger. This eliminates residue of cutting that might be caused due to the interference between the corner and the second support hole. As a result, contact failure can be avoided. Further, the second support hole 17A of the upper housing 17 and the first support hole 16A of the lower housing 16 are not required to be formed into a long-hole shape, thereby allowing cost reduction.

The slit portion 217 is provided to extend upwardly along the center axis of the first plunger 210B from the lower end portion 215B to a halfway point of the upper portion 212B. The slit portion 217 is to electrically contact the upper portion (the tip portion 221 and the coupling portion 222; see FIG. 10) of the second plunger 220 and to allow sliding motion of the upper portion of the second plunger 220. Specifically, inserting the coupling portion 222 of the second plunger 220 (see FIGS. 10, 15A, and 15B) into the slit portion 217 makes the inner surface of the slit portion 217 electrically contact a surface of the coupling portion 222 of the second plunger 220 to form electrical conduction. The coupling portion 222 of the second plunger 220 can slide in a vertical direction inside the slit portion 217. In this way, the slit portion 217 functions as a portion to form contact with the second plunger 220.

The slit portion 217 can be formed by cutting a circular columnar plunger upwardly from the lower end portion 215B, for example. The length of the slit portion 217 in a vertical direction can be set in such a manner as to conform to the length of the coupling portion 222 of the second plunger 220 (see FIG. 10) in its longitudinal direction and is desirably set at about several millimeters, for example.

The thickness of the slit portion 217 should be determined in consideration of the sliding motion of the coupling portion 222 of the second plunger 220 (see FIG. 10) in a vertical direction and electrical contact between the inner surface of the slit portion 217 and the coupling portion 222. It is desirable that the thickness of the slit portion 217 be set to be slightly larger than the thickness of the coupling portion 222 of the second plunger 220.

The spring retaining portion 216B is provided between the projecting portion 213B and the lower portion 214B. The spring retaining portion 216B is to receive a tight small-diameter portion corresponding to the upper end portion 231 of the spring part 230 (see FIG. 12). The outer diameter of the spring retaining portion 216B is set to be smaller than the outer diameter of the lower portion 214B. In this way, the tight small-diameter portion corresponding to the upper end portion 231 of the spring part 230 can be received at the spring retaining portion 216B to prevent the spring part 230 from falling off.

Like the lower end portion of the first embodiment, to facilitate insertion of the first plunger 210B into the inside of the spring part 230, the lower end portion 215B is formed into a tapered shape.

Figure 17A:
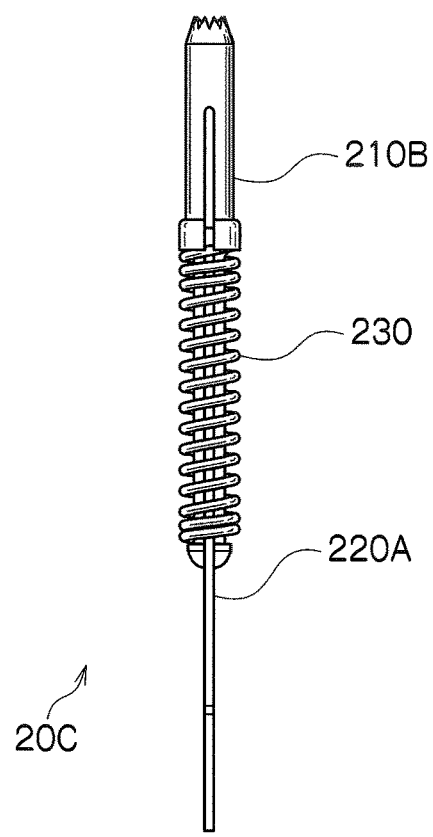
FIGS. 17A and 17B show the structure of an electrical contactor according to a modified embodiment of the second embodiment.
Figure 17B:
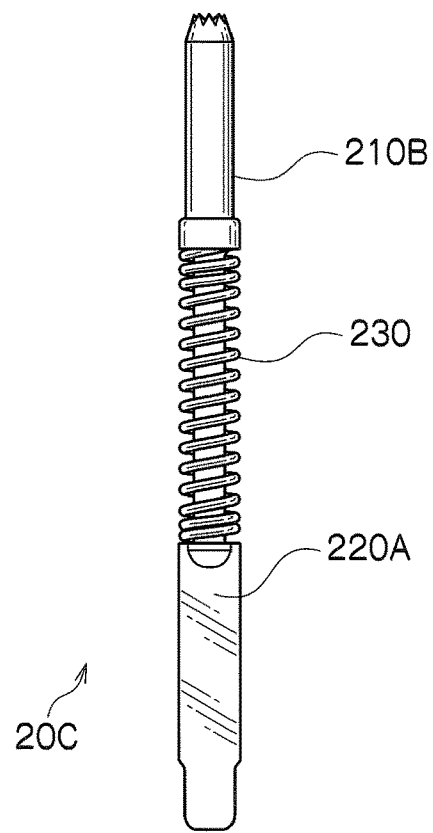

(B-2) Modified Embodiment of Second Embodiment (B-2-1) Modified Embodiment of Second Plunger FIG. 17A is a front view showing the structure of an electrical contactor 20C according to a modified embodiment of the second embodiment. FIG. 17B is a side view showing the structure of the electrical contactor 20C according to the modified embodiment of the second embodiment.

According to the aforementioned second embodiment, the second plunger 220 of the electrical contactor 20B is described as being the same as the second plunger 220 of the first embodiment described by referring to FIGS. 10 and 11.

However, the electrical contactor 20B may include the plate-like second plunger 220A illustrated in FIG. 14 instead of the second plunger 220.

As shown in FIGS. 17A, 17B, and 14, by using the plate-like second plunger 220A instead of the second plunger 220, an electrical contactor can be provided at lower cost.

(B-2-2) Modified Embodiment where Second Plunger Includes Slit Portion

Figure 18A:
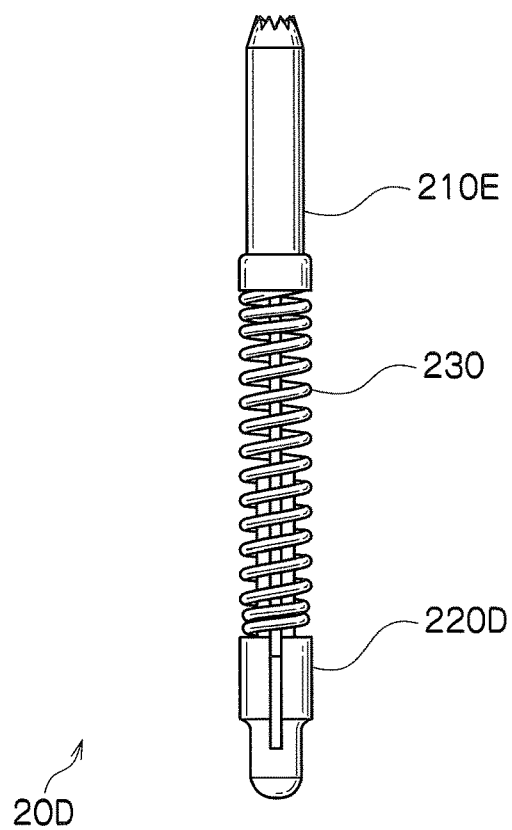
FIGS. 18A and 18B are a front view and a side view respectively showing the structure of an electrical contactor according to a modified embodiment of the second embodiment.
Figure 18B:
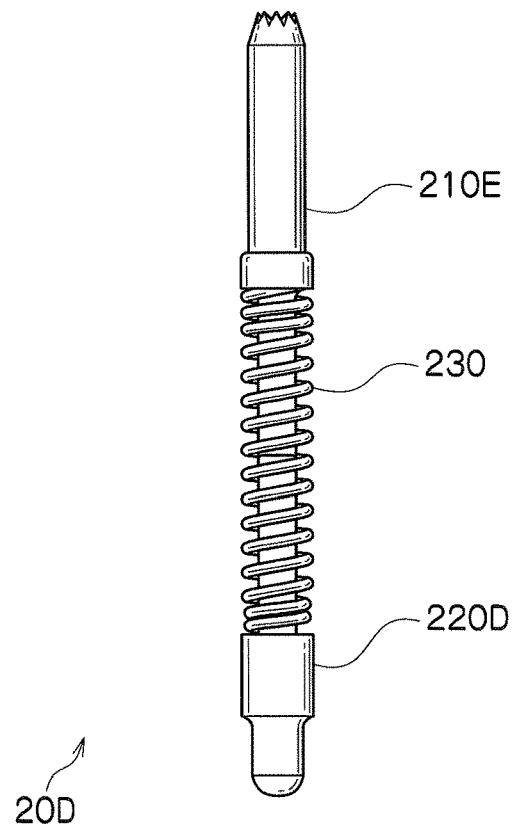

FIG. 18A is a front view showing the structure of an electrical contactor 20D according to a modified embodiment of the second embodiment. FIG. 18B is a side view showing the structure of the electrical contactor 20D according to the modified embodiment of the second embodiment.

In the aforementioned second embodiment, the first plunger 210B to electrically contact the electrode 13 is described as including the slit portion 217.

As illustrated in FIGS. 18A and 18B, a second plunger 220D to contact the contact pad 22 on the wiring substrate 15 may include a slit portion.

As shown in FIGS. 18A and 18B, the electrical contactor 20D includes a first plunger 210E, the second plunger 220D, and the spring part 230.

The second plunger 220D has a substantially circular columnar shape extending along its center axis from an upper portion to a halfway point of a lower portion. This slit portion functions as a portion to form contact with the first plunger 210E.

The first plunger 210E has a structure illustrated in FIGS. 20A and 20B according to a third embodiment described later. The first plunger 210E includes a tip portion having a plurality of chevron shapes, an upper portion of a circular columnar shape continuous with the tip portion, and a plate-like coupling portion.

Inserting the coupling portion of the first plunger 2103 into the slit portion of the second plunger 220D makes the inner surface of the slit portion electrically contact a surface of this coupling portion to form electrical conduction. The coupling portion of the first plunger 210E can slide in a vertical direction inside the slit portion. The electrical contactor 20D illustrated in FIGS. 18A and 18B achieves advantageous effect comparable to that achieved by the electrical contactor 20B according to the second embodiment.

(B-3) Advantageous Effect of Second Embodiment

As described above, the second embodiment achieves advantageous effect comparable to that achieved by the first embodiment.

According to the second embodiment, one first plunger is prepared that is to electrically contact an electrode of a device under test. This can suppress displacement of the first plunger during electrical contact of the first plunger with the electrode. As a result, the first plunger can electrically contact the electrode reliably.

(C) Third Embodiment

A third embodiment of the electrical contactor and the electrical connecting apparatus according to this invention will be described below in detail by referring to the drawings.

An electrical contactor according to the third embodiment has a structure differing from the aforementioned structure of the electrical contactor according to the first embodiment. An electrical connecting apparatus according to the third embodiment can be the same as or comparable to the electrical connecting apparatus 11 according to the first embodiment shown in FIGS. 1 to 3.

Thus, the following description of the third embodiment is mainly intended for the detailed structure of the electrical contactor and the electrical connecting apparatus will not be described in detail.

(C-1) Detailed Description of Electrical Contactor

The structure of an electrical contactor 20E according to the third embodiment will be described in detail by referring to FIGS. 19A, 19B, 20A, 20B, and 21.

Figure 19A:
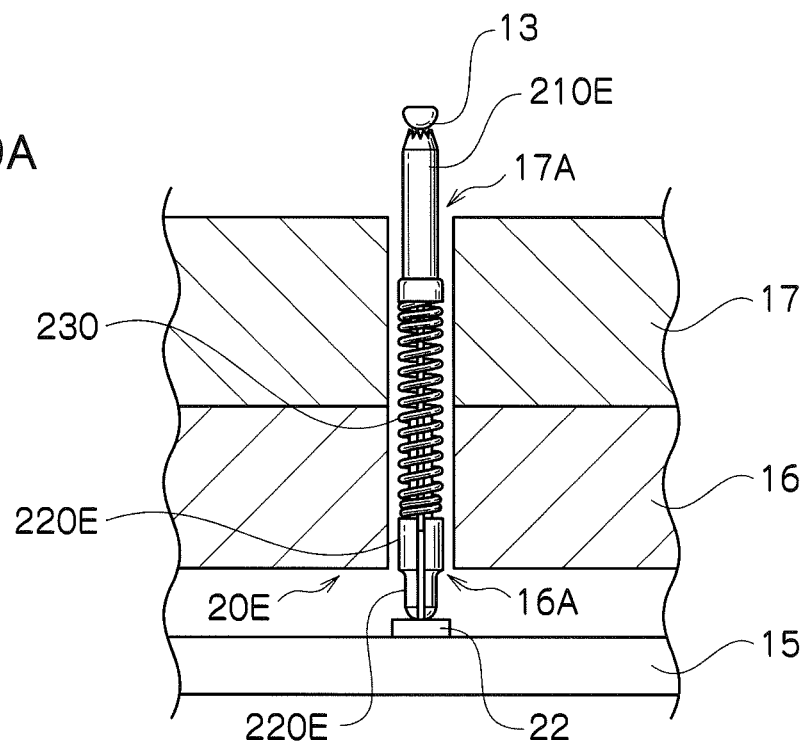
FIGS. 19A and 19B show the structure of an electrical contactor according to a third embodiment.
Figure 19B:
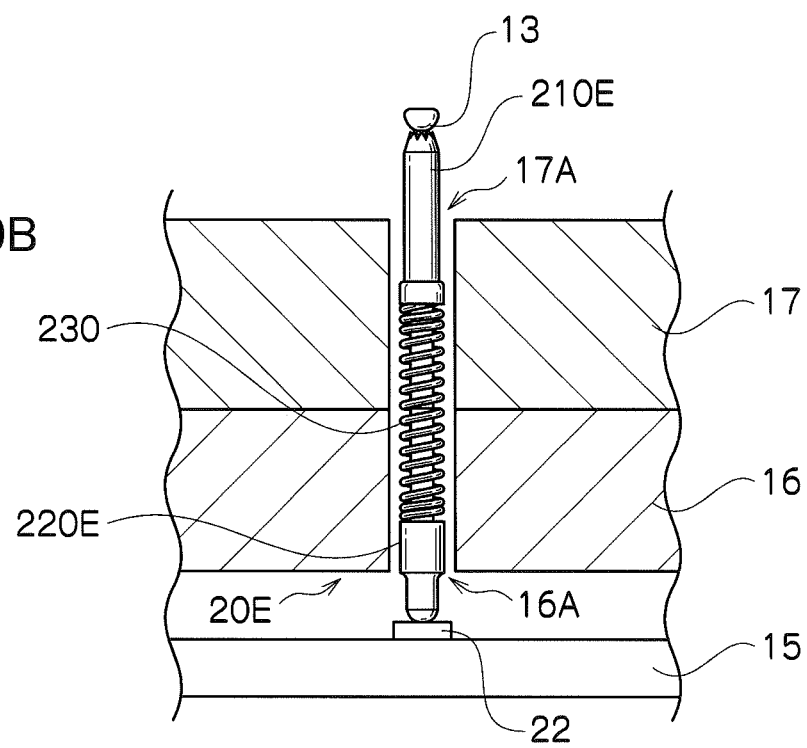

FIG. 19A is a front view showing the structure of the electrical contactor 20E according to the third embodiment. FIG. 19B is a side view showing the structure of the electrical contactor 20E according to the third embodiment.

Figure 20A:
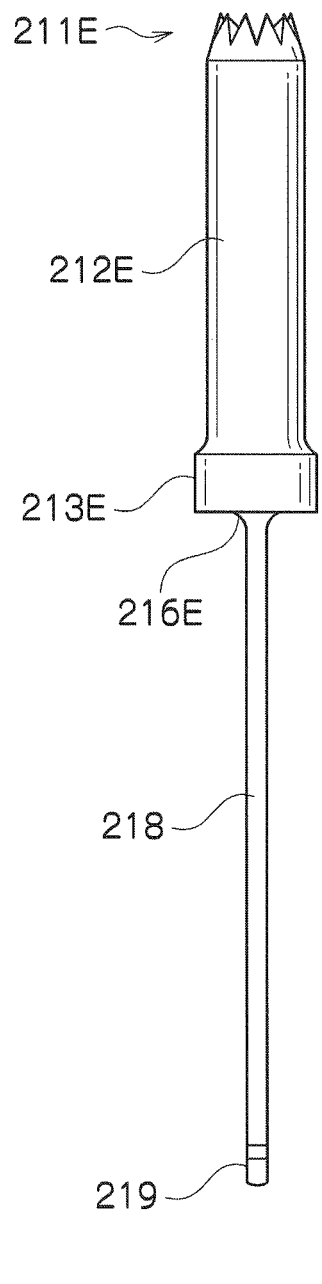
FIGS. 20A and 20B show the structure of a first plunger according to the third embodiment.

FIG. 20A is a front view showing the structure of the first plunger 210E according to the third embodiment. FIG. 20B is a side view showing the structure of the first plunger 210E according to the third embodiment.

Figure 21:
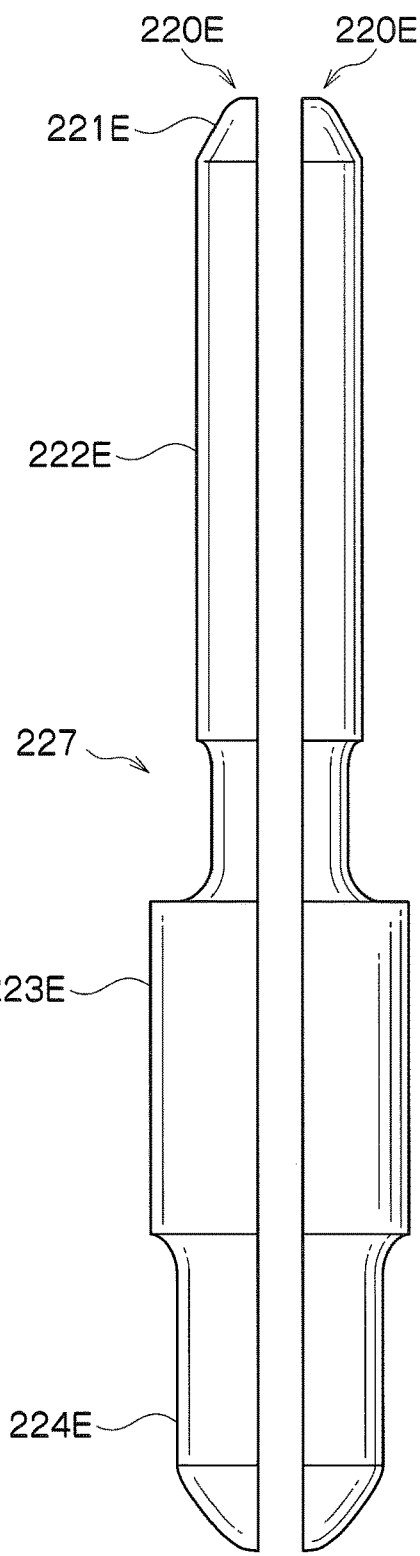
FIG. 21 shows the structure of a second plunger according to the third embodiment.

FIG. 21 is a front view showing the structure of a second plunger 220E according to the third embodiment.

The electrical contactor 20 (or 20A) according to the first embodiment is described as including two first plungers to contact the electrode 13 of the device under test 12 and one second plunger to contact the contact pad 22 on the wiring substrate 15.

By contrast, the electrical contactor 20E according to the third embodiment is described as including one plunger to contact the electrode 13 and two second plungers to contact the contact pad 22 on the wiring substrate 15.

As shown in FIGS. 19A and 19B, the electrical contactor 20E includes the first plunger 210E, the second plunger 220E, and the spring part 230.

In the electrical contactor 20E, a lower portion of one first plunger 210E is arranged to overlap respective upper portions of the two second plungers 220E while being caught between these upper portions. Apart where the first plunger 210E and the second plungers 220E are coupled to each other is covered by the spring part 230.

The outer diameter of the electrical contactor 20E is smaller than the inner diameter of the second support hole 17A of the upper housing 17 and the inner diameter of the first support hole 16A of the lower housing 16. This allows the electrical contactor 20E to slide in a vertical direction when the electrical contactor 20E contacts the electrode 13 of the device under test 12 electrically.

FIG. 20A is a front view showing the structure of the first plunger 210E according to the third embodiment. FIG. 20B is a side view showing the structure of the first plunger 210E according to the third embodiment.

Figure 20B:
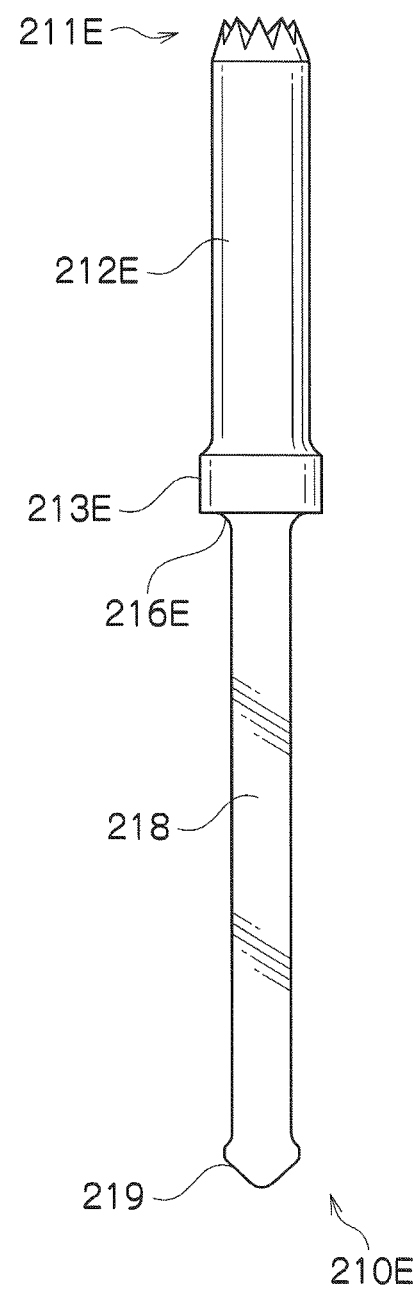

Referring to FIGS. 20A and 20B, the first plunger 210E includes a tip portion 211E, an upper portion 212E, a projecting portion 213E, a coupling portion 218, and a lower end portion 219.

Like the tip portion 211B of the first plunger 210B according to the second embodiment (see FIG. 16), the tip portion 211E has a substantially circular columnar shape. Further, the tip portion 211E is recessed at the center and formed into a shape tapered from the center of the tip portion 211E toward the top of a chevron shape. Specifically, each of a plurality of chevron shapes at the tip portion 211E has a substantially triangular prism shape and the shape of the tip portion 211E is defined by a succession of a substantially triangular prism shape and an adjacent substantially triangular prism shape.

Like the upper portion 211B of the first plunger 210B (see FIG. 16) according to the second embodiment, the upper portion 212E has a circular columnar shape. Thus, by housing the electrical contactor 20E in the second support hole 17A and the first support hole 16A (see FIGS. 19A and 19B), the housed electrical contactor 20E is placed in a stable condition in the first support hole 16A and the second support hole 17A. Further, the upper portion 212E has a substantially circular columnar shape. Thus, a marginal gap between the first plunger 210E and the second support hole 17A can be blocked. This can interrupt a droplet path (gap) through which droplets resulting from dew condensation are to drip down. Additionally, the circular columnar shape of the upper portion 212E eliminates residue of cutting that might be caused due to interference with and the second support hole. As a result, contact failure can be avoided.

The coupling portion 218 and the lower end portion 219 are each formed into a plate-like shape. The coupling portion 218 and the lower end portion 219 overlap the respective planar sections of the two second plungers 220E illustrated in FIG. 21 to electrically contact respective upper portions 222E of the two second plungers 220E.

The lower end portion 219 is to guide insertion of the coupling portion 218 into the inside of the spring part 230. A surface of the lower end portion 219 is curved and tilted.

The width value (dimension) of the coupling portion 218 may be set to be substantially the same as or slightly smaller than the width value of the planar section of each of the second plungers 220E of FIG. 21. By doing so, an area of electrical contact between the lower end portion 219 and the coupling portion 218 of the first plunger 210E and the planar section of the second plunger 220E can be increased, thereby achieving favorable electrical conduction.

Referring to FIG. 21, each of the two second plungers 220E has a substantially semicircular columnar shape. Each of the two second plungers 220E can be formed by cutting a plunger of a substantially circular columnar shape along its center axis, for example. Thus, the two second plungers 220E are arranged in such a manner that the respective planar sections of the substantially semicircular columnar second plungers 220E face each other.

The semicircular columnar shape of each of the second plungers 220E allows the lower end of the second plunger 220E to electrically contact the contact pad 22 (see FIGS. 19A and 19B) stably. As a result of the capability of the second plunger 220E to electrically contact the contact pad 22 reliably, the second plunger 220E can be made of a material (metal) not entailing high cost.

The second plunger 220E includes a tip portion 221E, the upper portion 222E, a lower portion 223E, a lower end portion 224E, and a spring retaining portion 227.

The upper portion 222E has a substantially semicircular columnar shape. The respective planar sections of the two second plungers 220E are arranged to face each other and to overlap each other while the coupling portion 218 of the first plunger 210E (see FIGS. 20A and 20B) is caught between these planar sections. In this way, the first plunger 210E and the second plungers 220E electrically contact each other to achieve electrical conduction. To allow the outer periphery of the upper portion 222E to be covered by the spring part 230 (see FIGS. 19A and 19B), the outer diameter of the upper portion 222E is smaller than the outer diameter of the lower portion 223E.

The spring retaining portion 227 is provided between the upper portion 222E and the lower portion 223E. The spring retaining portion 227 is to receive a tight small-diameter portion corresponding to the lower end portion 232 of the spring part 230. The outer diameter of the spring retaining portion 227 is set to be smaller than the outer diameter of the lower portion 222E. In this way, the tight small-diameter portion corresponding to the lower end portion 232 of the spring part 230 (see FIG. 12) can be received at the spring retaining portion 227 to prevent the spring part 230 from falling off.

The lower portion 223E has a substantially semicircular columnar shape. The lower end portion 224E has a substantially semicircular columnar shape and has an outer diameter set to be smaller than the outer diameter of the lower portion 223E.

(C-2) Modified Embodiment of Third Embodiment

Figure 22A:
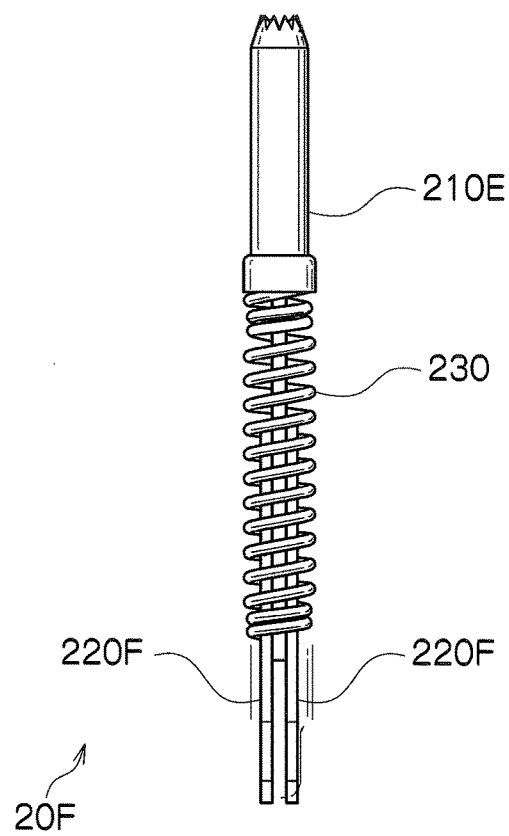
FIGS. 22A and 22B show the structure of an electrical contactor according to a modified embodiment of the third embodiment.
Figure 22B:
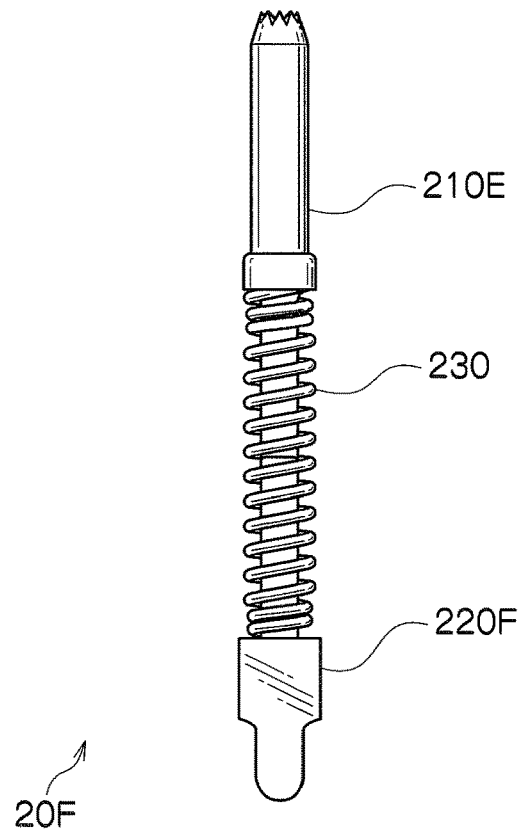
Figures 23A, 23B:
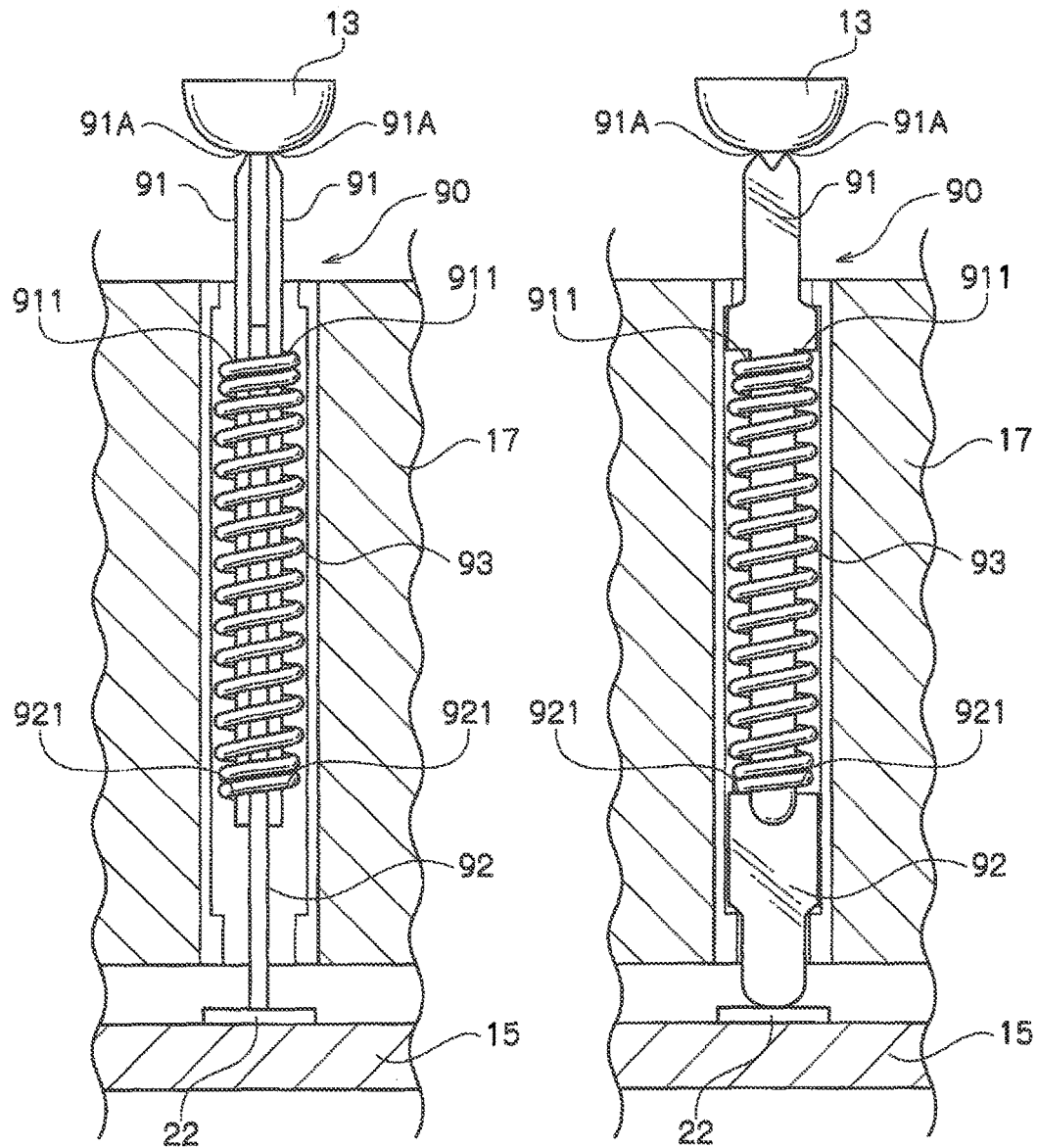
FIGS. 23A and 23B show a part of a conventional electrical connecting apparatus where a conventional electrical contactor is attached.
Figure 24:
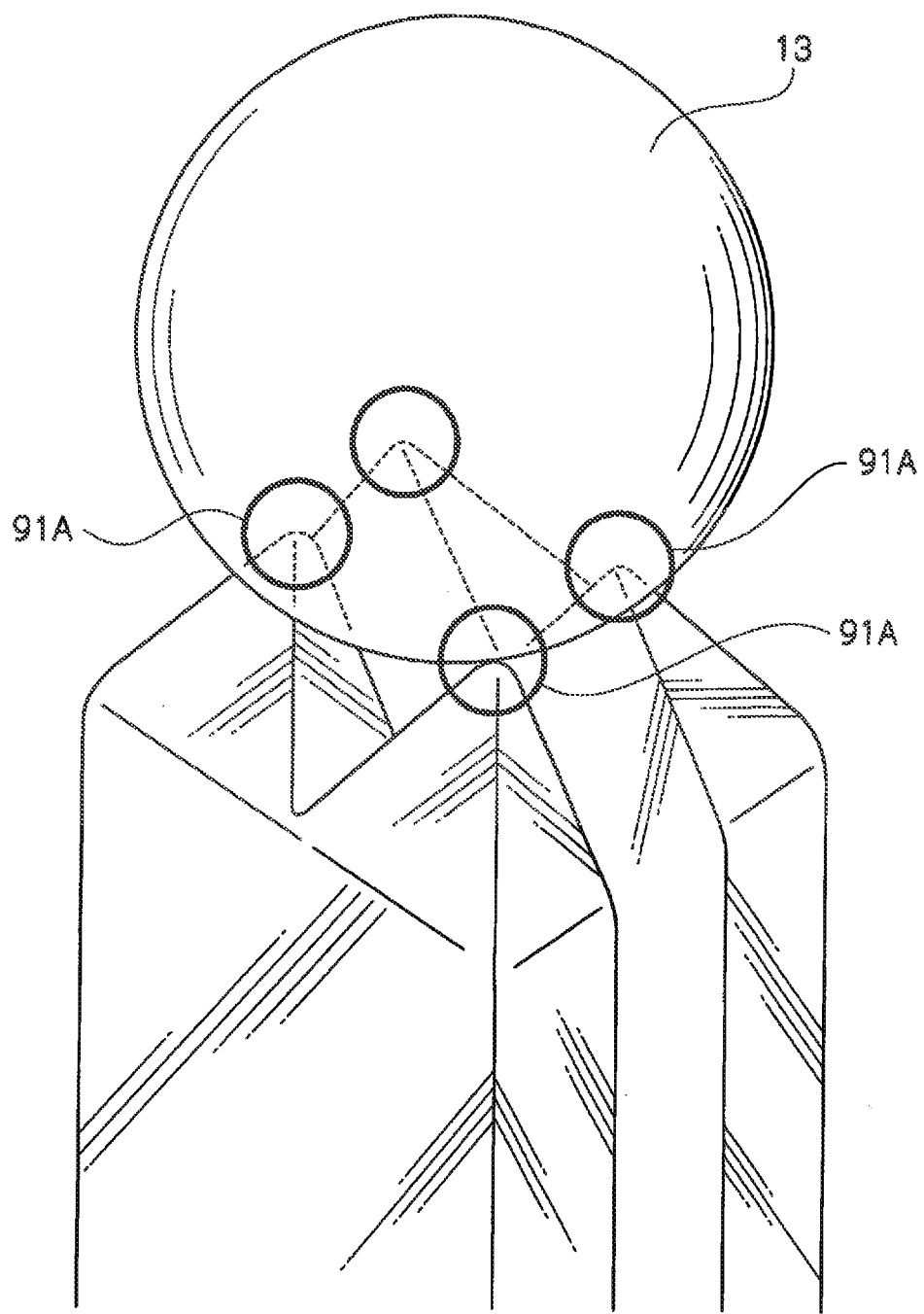
FIG. 24 shows electrical contact with an electrode by the conventional electrical contactor.
Figure 25:
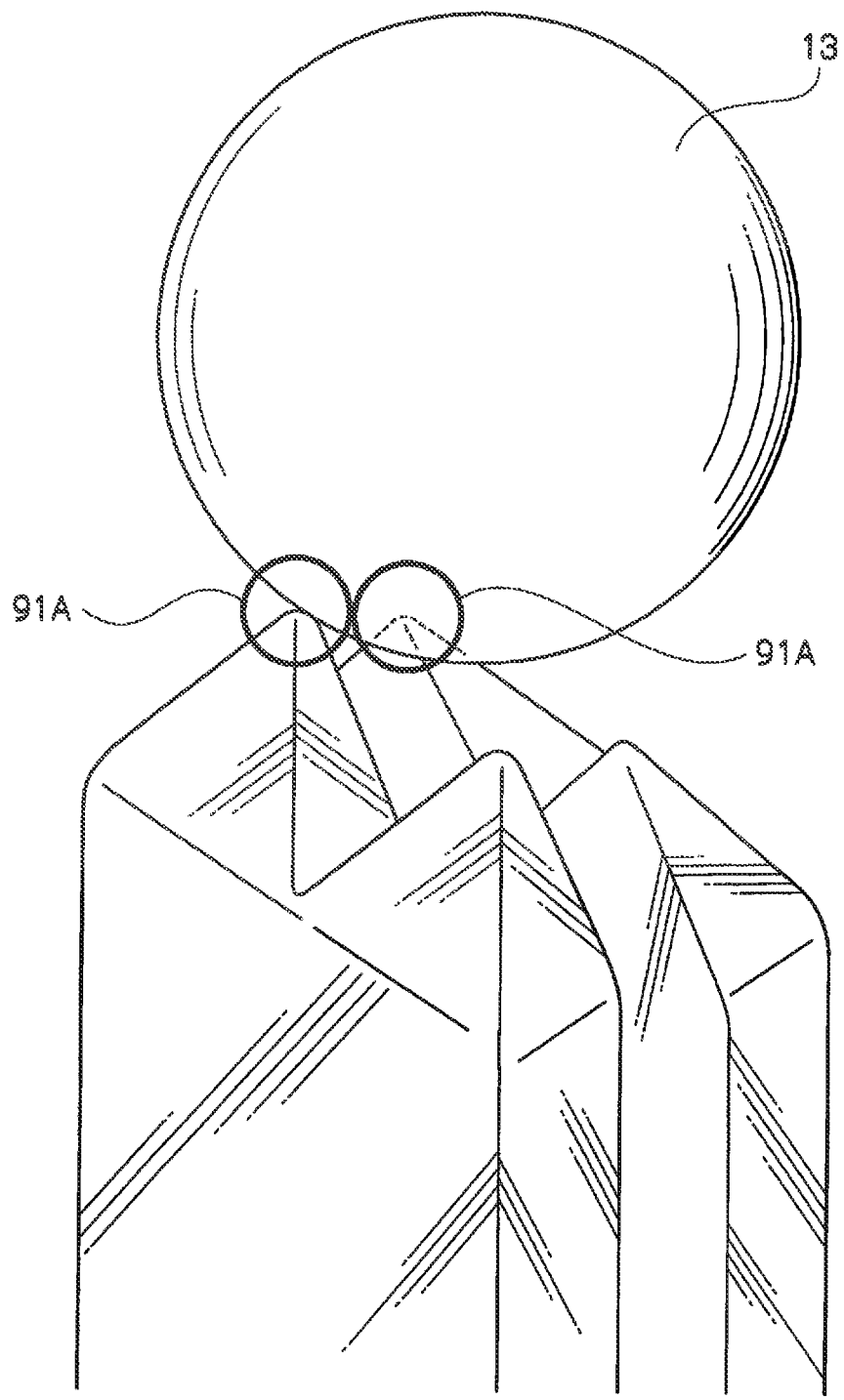
FIG. 25 shows electrical contact with an electrode by the conventional electrical contactor with a plunger of the electrical contactor being displaced.
Figure 26:
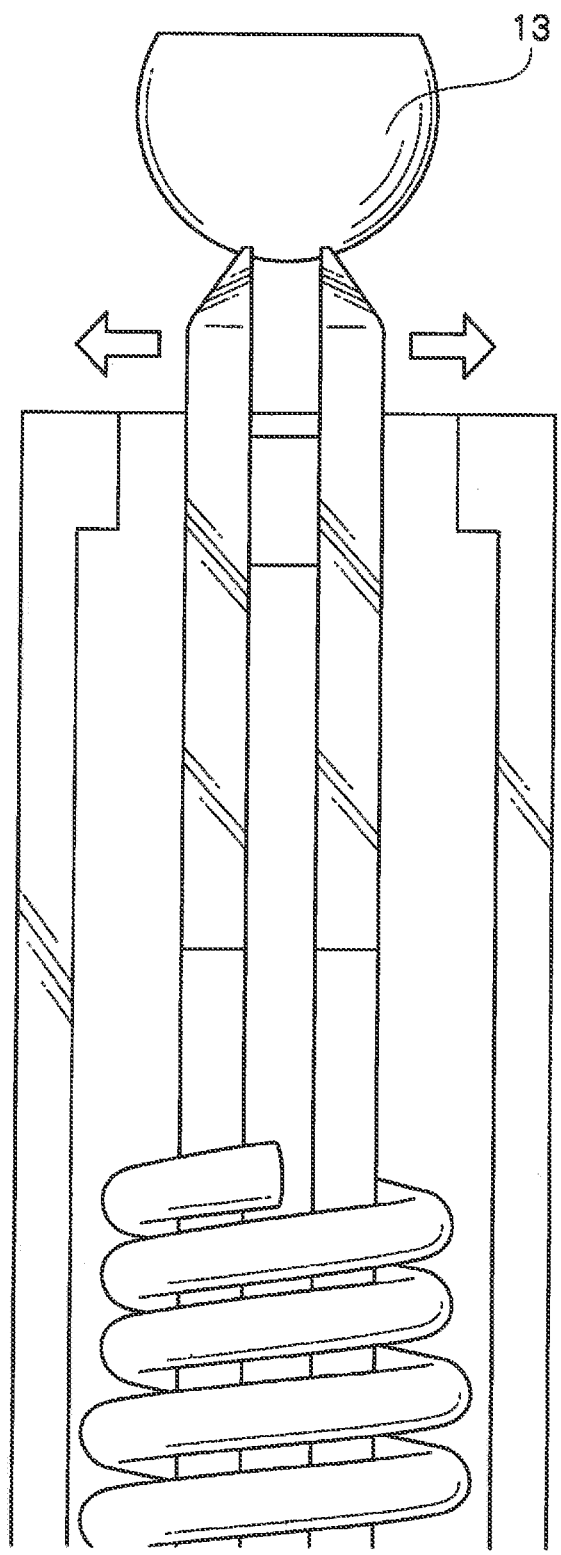
FIG. 26 explains displacement of a conventional plunger occurring when the plunger contacts an electrode.
Figure 27A:
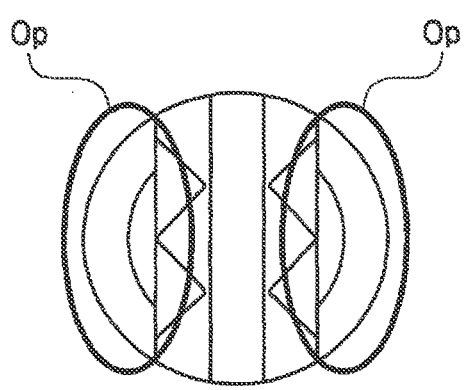
FIGS. 27A and 27B explain a relationship between a conventional support hole for housing and a plunger (first explanatory views)
Figure 27B:
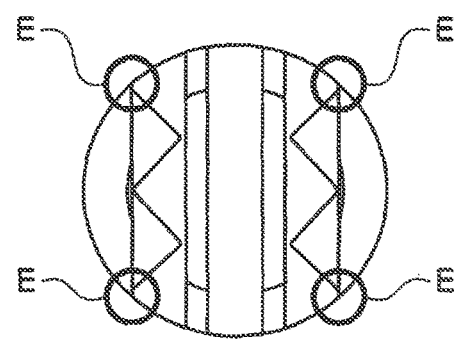
Figures 28A, 28B:
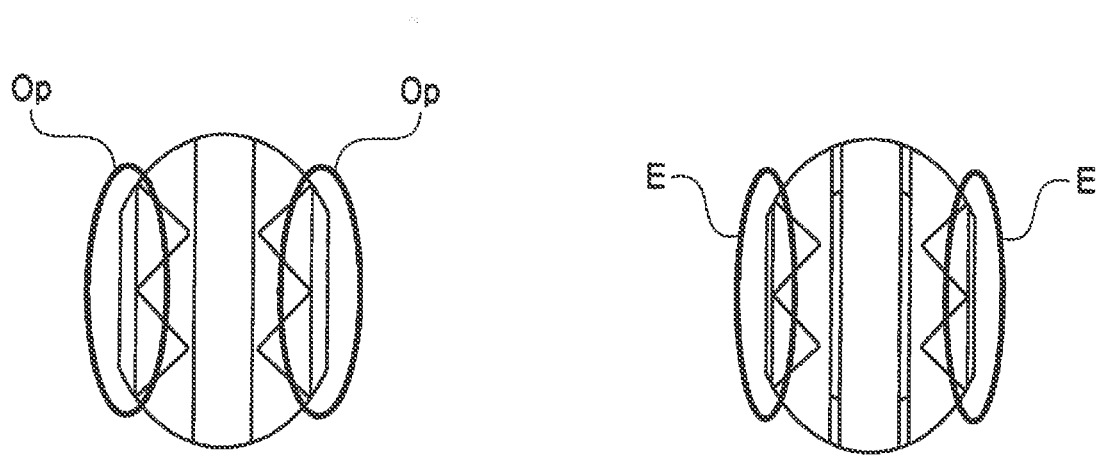
FIGS. 28A and 28B explain a relationship between the conventional support hole for housing and the plunger (second explanatory views).

FIG. 22A is a front view showing the structure of an electrical contactor 20F according to a modified embodiment of the third embodiment. FIG. 22B is a side view showing the structure of the electrical contactor 20F according to the modified embodiment of the third embodiment.

According to the aforementioned third embodiment, each of the two second plungers 220E of the electrical contactor 20E is described as having a substantially semicircular columnar shape.

However, the electrical contactor 20F may include plate-like two second plungers 220F instead of the second plungers 220E.

As shown in FIGS. 22A and 22B, by using the plate-like second plunger 220F instead of the substantially semicircular columnar second plunger 220E, an electrical contactor can be provided at lower cost.

(C-3) Advantageous Effect of Third Embodiment

As described above, the third embodiment achieves advantageous effect comparable to that achieved by the first embodiment.

According to the third embodiment, one first plunger is prepared that is to electrically contact an electrode of a device under test and two second plungers are prepared that are to electrically contact a contact pad. This can suppress displacement of the first plunger. Thus, the first plunger can electrically contact the electrode reliably to achieve reliable electrical contact with the contact pad.

(D) Other Embodiments

In the aforementioned first to third embodiments, the tip portion of the first plunger is described as including a plurality of chevron shapes.

The number of chevron shapes formed at the tip portion is not particularly limited. Meanwhile, it is desirable a larger number of chevron shapes be formed at the tip portion in order for the chevron shapes to contact an electrode of a device under test at a larger number of points to electrically contact the electrode reliably. In the first to third embodiments, five chevron shapes are formed at the tip portion, for example. However, the number of chevron shapes at the tip portion may be three or four, or six or more, for example.

The angle of the top of a chevron shape on the outer peripheral surface of the tip portion changes in a manner that depends on the number of chevron shapes at the tip portion. It is desirable that the angle of the top of a chevron shape be from several degrees to several tens of degrees. In consideration of deformation or wear of a chevron shape that might be caused by a load on the chevron shape as a result of electrical contact of the chevron shape with an electrode, it is preferable that the angle of the top of the chevron shape be from about 45 to about 50 degrees.

A span between the tips of chevrons (length from the top of one chevron to the top of a chevron facing the former chevron) is determined in a manner that depends on the dimension of an electrode and is desirably from about several hundreds of micrometers to about several millimeters, for example. It is also desirable that the length of the tip portion 211 in the height direction of a chevron shape be about several tens of micrometers. These settings are made for reason of allowing the first plunger 210 to electrically contact a ball-shaped electrode reliably.

The electrical contactor according to this invention is applicable to every unit to contact an electrode provided in a wiring substrate or a semiconductor integrated circuit, for example.

The electrical connecting apparatus according to this invention is applicable to every apparatus that can use the electrical contactor according to this invention.

The invention claimed is:

1. An electrical contactor comprising:
  a first plunger to contact one member, the first plunger including a tip portion formed into a plurality of chevron shapes;
  a second plunger to contact a counterpart member, the second plunger contacting the first plunger while overlapping a portion of the first plunger and working in cooperation with the first plunger to form electrical conduction between the one member and the counterpart member; and
  a spring part to couple the tip portion of the first plunger and a tip portion of the second plunger while the tip portion of the first plunger and the tip portion of the second plunger are pointed in opposite directions, the spring part covering an outer periphery of a part where the first plunger and the second plunger are coupled, the spring part abutting on a receiving portion of each of the first plunger and the second plunger, thereby supporting the first plunger and the second plunger in a manner that allows the first plunger and the second plunger to slide relative to each other, wherein
  the first plunger includes two plungers each having a substantially semicircular columnar shape,
  a planar section of one of the first plungers and a planar section of the other of the first plungers are arranged to face each other, and
  a tip portion of the one of the first plungers and a tip portion of the other of the first plungers contact a surface of the one member at multiple points.

2. An electrical connecting apparatus to contact an electrode of a device under test to conduct a test,
  the electrical connecting apparatus comprising a plurality of electrical contactors provided in positions corresponding to electrodes of the device under test, each of the electrical contactors causing a current to pass through by contacting a corresponding one of the electrodes, wherein
  the electrical contactor as recited in claim 1 is used as each of the electrical contactors of the electrical connecting apparatus.

3. The electrical contactor, comprising:
  a first plunger to contact one member, the first plunger including a tip portion formed into a plurality of chevron shapes;
  a second plunger to contact a counterpart member, the second plunger contacting the first plunger while overlapping a portion of the first plunger and working in cooperation with the first plunger to form electrical conduction between the one member and the counterpart member; and
  a spring part to couple the tip portion of the first plunger and a tip portion of the second plunger while the tip portion of the first plunger and the tip portion of the second plunger are pointed in opposite directions, the spring part covering an outer periphery of a part where the first plunger and the second plunger are coupled, the spring part abutting on a receiving portion of each of the first plunger and the second plunger, thereby supporting the first plunger and the second plunger in a manner that allows the first plunger and the second plunger to slide relative to each other, wherein
  the first plunger includes two plungers each having a substantially semicircular columnar shape,
  the second plunger at least includes a plate-like coupling portion overlapping the first plungers, and
  a planar section of one of the first plungers and a planar section of the other of the first plungers contact the coupling portion of the second plunger while the coupling portion is caught between the planar section of the one of the first plungers and the planar section of the other of the first plungers.

4. An electrical connecting apparatus to contact an electrode of a device under test to conduct a test,
  the electrical connecting apparatus comprising a plurality of electrical contactors provided in positions corresponding to electrodes of the device under test, each of the electrical contactors causing a current to pass through by contacting a corresponding one of the electrodes, wherein
  the electrical contactor as recited in claim 3 is used as each of the electrical contactors of the electrical connecting apparatus.

5. The electrical contactor, comprising:
  a first plunger to contact one member, the first plunger including a tip portion formed into a plurality of chevron shapes;
  a second plunger to contact a counterpart member, the second plunger contacting the first plunger while overlapping a portion of the first plunger and working in cooperation with the first plunger to form electrical conduction between the one member and the counterpart member; and
  a spring part to couple the tip portion of the first plunger and a tip portion of the second plunger while the tip portion of the first plunger and the tip portion of the second plunger are pointed in opposite directions, the spring part covering an outer periphery of a part where the first plunger and the second plunger are coupled, the spring part abutting on a receiving portion of each of the first plunger and the second plunger, thereby supporting the first plunger and the second plunger in a manner that allows the first plunger and the second plunger to slide relative to each other, wherein the first plunger at least includes a plate-like coupling portion overlapping the second plunger, the second plunger includes two plungers, and a planar section of one of the second plungers and a planar section of the other of the second plungers contact the coupling portion of the first plunger while the coupling portion is caught between the planar section of the one of the second plungers and the planar section of the other of the second plungers.

6. An electrical connecting apparatus to contact an electrode of a device under test to conduct a test, the electrical connecting apparatus comprising a plurality of electrical contactors provided in positions corresponding to electrodes of the device under test, each of the electrical contactors causing a current to pass through by contacting a corresponding one of the electrodes, wherein the electrical contactor as recited in claim 5 is used as each of the electrical contactors of the electrical connecting apparatus.

\* \* \* \* \*